(12) United States Patent
Donofrio

(10) Patent No.: US 8,896,008 B2
(45) Date of Patent: Nov. 25, 2014

(54) LIGHT EMITTING DIODES HAVING GROUP III NITRIDE SURFACE FEATURES DEFINED BY A MASK AND CRYSTAL PLANES

(71) Applicant: Cree, Inc., Durham, NC (US)

(72) Inventor: Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/868,361

(22) Filed: Apr. 23, 2013

(65) Prior Publication Data

US 2014/0312373 A1    Oct. 23, 2014

(51) Int. Cl.
*H01L 33/46* (2010.01)
*H01L 33/22* (2010.01)
*H01L 33/32* (2010.01)
*H01L 33/20* (2010.01)
*H01L 33/42* (2010.01)
*H01L 33/38* (2010.01)

(52) U.S. Cl.
CPC ............... *H01L 33/22* (2013.01); *H01L 33/32* (2013.01); *H01L 33/20* (2013.01); *H01L 33/382* (2013.01); *H01L 33/42* (2013.01)
USPC .......................................................... 257/98

(58) Field of Classification Search
CPC ... H01L 33/20; H01L 33/0075; H01L 33/007; H01L 22/38; H01L 33/42; H01L 33/46; H01L 33/382
USPC ................................................ 257/98, 99, 79
See application file for complete search history.

(56) References Cited

U.S. PATENT DOCUMENTS

| | | |
|---|---|---|
| 4,865,685 A | 9/1989 | Palmour |
| 4,902,356 A | 2/1990 | Noguchi et al. |
| 4,912,532 A | 3/1990 | Cook et al. |
| 5,103,271 A | 4/1992 | Izumiya et al. |
| 5,376,580 A | 12/1994 | Kish et al. |
| 5,502,316 A | 3/1996 | Kish et al. |
| 5,679,152 A | 10/1997 | Tischler et al. |
| 5,773,369 A | 6/1998 | Hu et al. |
| 5,779,924 A | 7/1998 | Krames et al. |

(Continued)

FOREIGN PATENT DOCUMENTS

| | | |
|---|---|---|
| EP | 0616376 A | 9/1994 |
| EP | 0795941 A | 9/1997 |

(Continued)

OTHER PUBLICATIONS

Dongsheng et al., "Characteristics of the GaN Polar Surface during an Etching Process in KOH Solution", *Phys. Stat. Sol.* (2) 180, (2000), p. 357.

(Continued)

*Primary Examiner* — Nikolay Yushin
(74) *Attorney, Agent, or Firm* — Myers Bigel Sibley & Sajovec, P.A.

(57) ABSTRACT

An LED includes a mesa having a Group III Nitride mesa face and a mesa sidewall, on an underlying LED structure. The mesa face includes Group III Nitride surface features having tops that are defined by mask features, having bottoms, and having sides that extend along crystal planes of the Group III Nitride. The mask features may include a two-dimensional array of dots that are spaced apart from one another. Related fabrication methods are also disclosed.

28 Claims, 14 Drawing Sheets

(56) References Cited

U.S. PATENT DOCUMENTS

| | | | |
|---|---|---|---|
| 5,909,458 | A | 6/1999 | Freitas et al. |
| 5,923,481 | A | 7/1999 | Skidmore et al. |
| 5,985,687 | A | 11/1999 | Bowers et al. |
| 6,071,795 | A | 6/2000 | Cheung et al. |
| 6,258,699 | B1 | 7/2001 | Chang et al. |
| 6,294,475 | B1 | 9/2001 | Schubert et al. |
| 6,303,405 | B1 | 10/2001 | Yoshida et al. |
| 6,365,429 | B1 | 4/2002 | Kneissl et al. |
| 6,420,199 | B1 | 7/2002 | Coman et al. |
| 6,420,242 | B1 | 7/2002 | Cheung et al. |
| 6,448,102 | B1 | 9/2002 | Kneissl et al. |
| 6,465,809 | B1 | 10/2002 | Furukawa et al. |
| 6,468,824 | B2 | 10/2002 | Chen et al. |
| 6,475,889 | B1 | 11/2002 | Ring |
| 6,559,075 | B1 | 5/2003 | Kelly et al. |
| 6,562,648 | B1 | 5/2003 | Wong et al. |
| 6,607,931 | B2 | 8/2003 | Streubel |
| 6,653,163 | B2 | 11/2003 | Van Hoof et al. |
| 6,657,236 | B1 | 12/2003 | Thibeault et al. |
| 6,677,173 | B2 | 1/2004 | Ota |
| 6,680,495 | B2 | 1/2004 | Fitzergald |
| 6,716,654 | B2 | 4/2004 | Hsu et al. |
| 6,740,604 | B2 | 5/2004 | Kelly et al. |
| 6,740,906 | B2 | 5/2004 | Slater, Jr. et al. |
| 6,757,314 | B2 | 6/2004 | Kneissl et al. |
| 6,781,159 | B2 | 8/2004 | Romano et al. |
| 6,786,390 | B2 | 9/2004 | Yang et al. |
| 6,791,119 | B2 | 9/2004 | Slater, Jr. et al. |
| 6,800,500 | B2 | 10/2004 | Coman et al. |
| 6,806,112 | B1 | 10/2004 | Horng et al. |
| 6,809,341 | B2 | 10/2004 | Hsu et al. |
| 6,846,686 | B2 | 1/2005 | Saeki et al. |
| 6,847,057 | B1 | 1/2005 | Gardner et al. |
| 6,849,878 | B2 | 2/2005 | Bader et al. |
| 6,936,862 | B1 | 8/2005 | Chang et al. |
| 6,979,075 | B2 | 12/2005 | Silverbrook et al. |
| 7,042,011 | B2 | 5/2006 | Takatani |
| 7,115,908 | B2 | 10/2006 | Watanabe et al. |
| 7,208,393 | B2 | 4/2007 | Haskell et al. |
| 7,332,365 | B2 | 2/2008 | Nakamura et al. |
| 7,407,872 | B2 | 8/2008 | Han et al. |
| 7,791,061 | B2 | 9/2010 | Edmond et al. |
| 7,897,420 | B2 | 3/2011 | Chu et al. |
| 8,357,923 | B2 | 1/2013 | Edmond et al. |
| 2001/0029086 | A1 | 10/2001 | Ogawa et al. |
| 2002/0000559 | A1 | 1/2002 | Hoof et al. |
| 2002/0063520 | A1 | 5/2002 | Yu et al. |
| 2002/0068396 | A1 | 6/2002 | Fitzergald |
| 2003/0119239 | A1 | 6/2003 | Koike et al. |
| 2003/0141506 | A1 | 7/2003 | Sano et al. |
| 2003/0173602 | A1 | 9/2003 | Hsu et al. |
| 2003/0197166 | A1 | 10/2003 | Ishida et al. |
| 2004/0041164 | A1 | 3/2004 | Thibeault et al. |
| 2004/0072382 | A1 | 4/2004 | Kelly et al. |
| 2004/0140765 | A1 | 7/2004 | Takekuma |
| 2005/0035354 | A1 | 2/2005 | Lin et al. |
| 2005/0093099 | A1 | 5/2005 | Koike et al. |
| 2005/0221519 | A1 | 10/2005 | Leung et al. |
| 2005/0247950 | A1 | 11/2005 | Nakamura et al. |
| 2005/0269583 | A1 | 12/2005 | Kim et al. |
| 2005/0285132 | A1 | 12/2005 | Orita |
| 2006/0049411 | A1 | 3/2006 | Nakamura et al. |
| 2006/0110839 | A1 | 5/2006 | Dawson et al. |
| 2006/0186418 | A1* | 8/2006 | Edmond et al. ............. 257/79 |
| 2009/0152573 | A1 | 6/2009 | Loh et al. |
| 2009/0283787 | A1 | 11/2009 | Donofrio et al. |
| 2012/0146044 | A1 | 6/2012 | Gmeinwieser et al. |
| 2013/0026519 | A1* | 1/2013 | Huang et al. ............. 257/98 |

FOREIGN PATENT DOCUMENTS

| | | |
|---|---|---|
| EP | 1553640 | 7/2005 |
| JP | 61-059886 | 3/1986 |
| JP | 11-238913 | 8/1999 |
| WO | WO 2004/070844 | 8/2004 |
| WO | WO 2005/064666 | 7/2005 |
| WO | WO 2005/117152 | 12/2005 |

OTHER PUBLICATIONS

E.F. Schubert et al., "Resonant Cavity Light-Emitting Diode", AT&T Bell Laboratories, Murry Hill, New Jersey, *Applied Physics Letters*, vol. 60, No. 8, Feb. 24, 1992, pp. 921-923.

E.F. Schubert, "Light Emitting Diodes", Cambridge University Press, (2003), pp. 198-211.

Fujii et al., "Increase in the Extraction Efficiency of GaN-based light-emitting diodes via Surface Roughening", *Applied Physics Letters*, vol. 84, No. 6, Feb. 9, 2004, pp. 855-857.

Gao Y. et al., "Roughening Hexagonal Surface Morphology on Laser Lift-Off(LLO) N-Face GaN with Simple Photo-Enhanced Chemical Wet Etching", *Japanese Journal of Applied Physics*, vol. 43, No. 5A, 2004, pp. L637-L639.

M.K. Kelly et al., "Optical Process for Liftoff of Group III-Nitride Films", *Physica Status Solidi, Rapid Research Note, Technische Universitat Munche*, Garching, Germany, (Nov. 28, 1996) pp. 1-2.

Stocker et al., "Crystallographic Wet Chemical Etching of GaN", *Applied Physics Letters*, vol. 73, No. 18, Nov. 2, 1998, p. 2654.

T. Palacious et al., Wet Etching of GaN Grown by Molecular Beam Epitaxy on Si(111), Instituto de Sistemas Optoelectronicos y Microtecnologia and Departamento de Ingenieria Electronica, ETSI Telecommunications, Universidad Politecnia de Madrid, Semi. Sci Technol 15(2000) 996-1000.

Transene Co., Inc., Gallium Phosphide Etchant Description, pp. 1-2, accessed Jan. 11, 2006 at http://www.transene.com/gap.html.

Youtsey et al., "Gallium Nitride Whiskers Formed by Selective Photoenhanced Wet Etching of Dislocations", *Applied Physics Letters*, vol. 73, No. 6, Aug. 10, 1998, pp. 797-799.

Cree, Inc., "*Direct Attach DA2432™ LEDs*", Data Sheet: CPR3FM Rev.-, 2011, 5 pp.

Cree, Inc., "*Direct Attach DA3547™ LEDs*", Data Sheet: CPR3EL Rev. A, 2010, 5 pp.

Cree, Inc., "*Direct Attach DA700™ LEDs*", Data Sheet: CPR3EU Rev.-, 2011, 5 pp.

Cree, Inc., "*Direct Attach DA1000™ LEDs*", Data Sheet: CPR3ES Rev. A, 2010, 5 pp.

Cree, Inc., "*Cree® EZ500™ Gen II LED*", Data Sheet: CPR3EB Rev.-, 2009, 5 pp.

Cree, Inc., "*Cree® EZ600™ Gen II LED*", Data Sheet: CPR3EE Rev. A, 2010, 5 pp.

Cree, Inc., "*Cree® EZ900™ Gen II LEDs*", Data Sheet: CPR3DX Rev. B, 2008-2011, 6 pp.

Cree, Inc., "*Cree® EZ1000™ Gen II LEDs*", Data Sheet: CPR3EC Rev. A, 2009, 5 pp.

Cree, Inc., "*Cree® EZ1400™ Gen II LEDs*", Data Sheet: CPR3EK Rev.-, 2010, 5 pp.

"Cone" (n.d.), in *Wikipedia*. Retrieved Mar. 18, 2013 from http://en.wikipedia.org/w/index.php?title=Cone&printable=yes. 5 pp.

International Search Report and Written Opinion of the International Searching Authority, PCT Application No. PCT/US14/34780, Sep. 3, 2014.

Albert et al., "Monolithic integration of InGaN segments emitting in the blue, green, and red spectral range in single ordered nanocolumns", *Applied Physics Letters*, 102(181103), May 6, 2013 [Online] retrieved Jul. 24, 2014 from http://www.pdi-berlin.de/fileadmin/rsync_intra4_www1/externe_Publikationen/2013/apl102sa.pdf, 4 pp.

Coquillat et al., "Studies of the photonic and optical-frequency phonon properties of arrays of selectively grown GaN micropyramids", *Journal of Applied Physics*, 103(044910), Feb. 28, 2008 [Online] retrieved Jul. 24, 2014 from http://eprints.soton.ac.uk/271016/1/Studies_of_the._Photonic_and_Optical_Frquency_Phonon_Properties_of_Arrays_of_Selectively_Grown_GAN_Microopyramids.pdf , 7 pp.

* cited by examiner

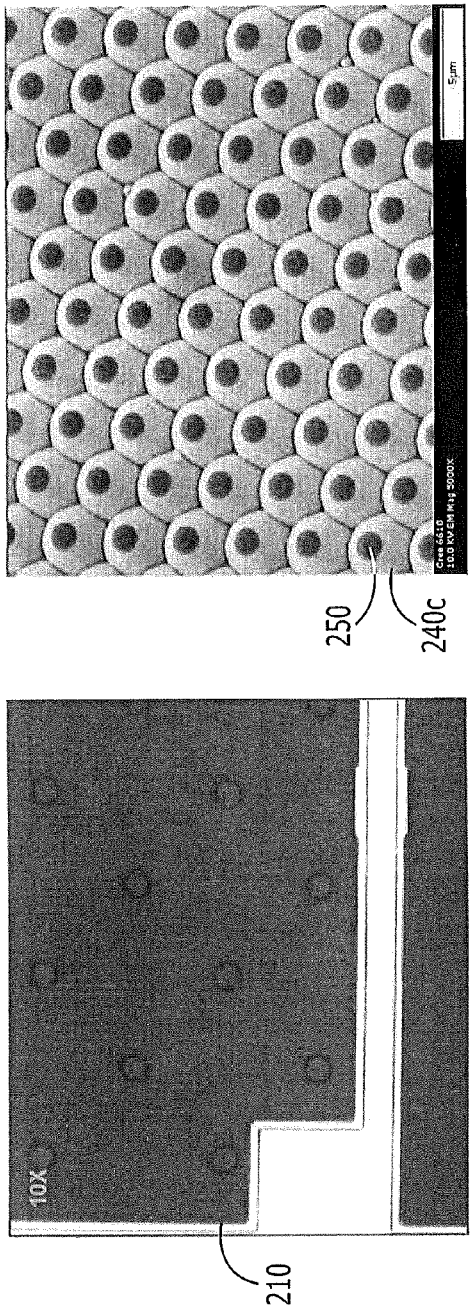
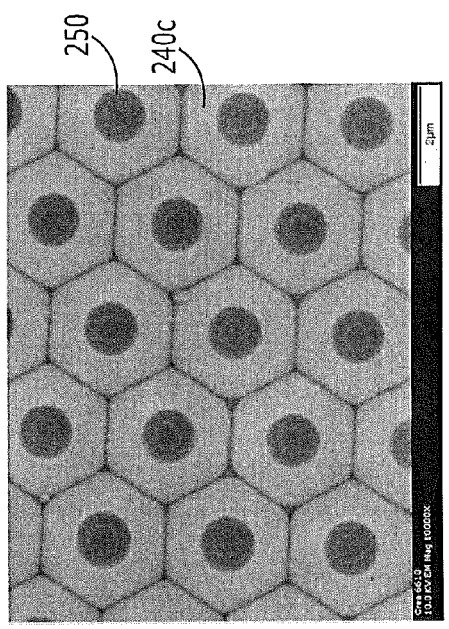
FIG. 6A
FIG. 6B
FIG. 6C

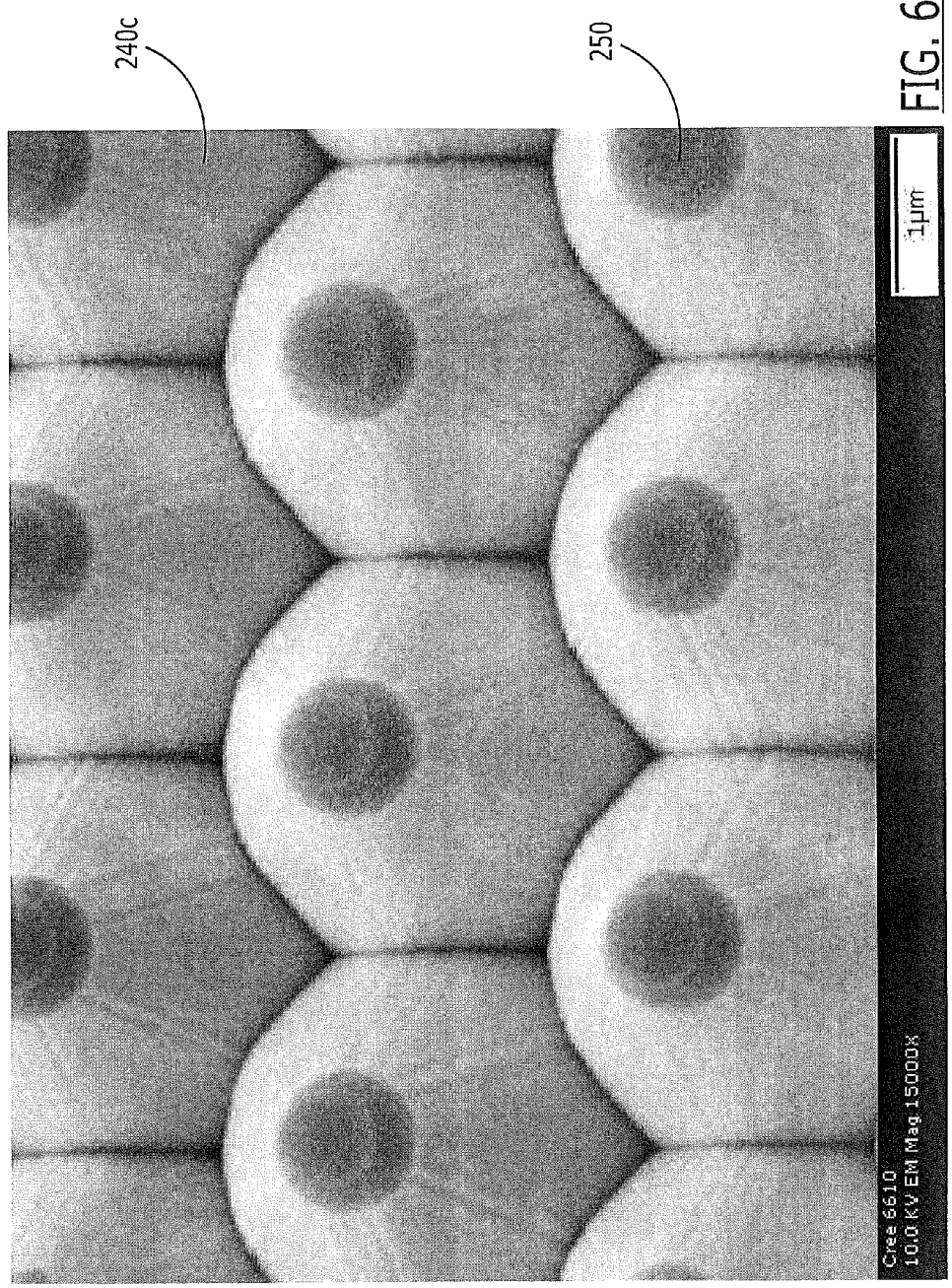

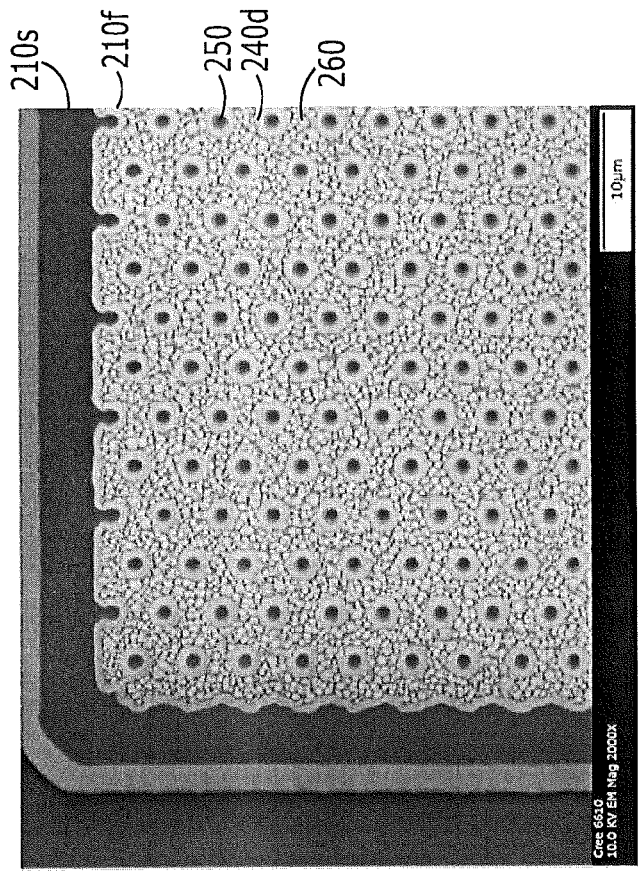
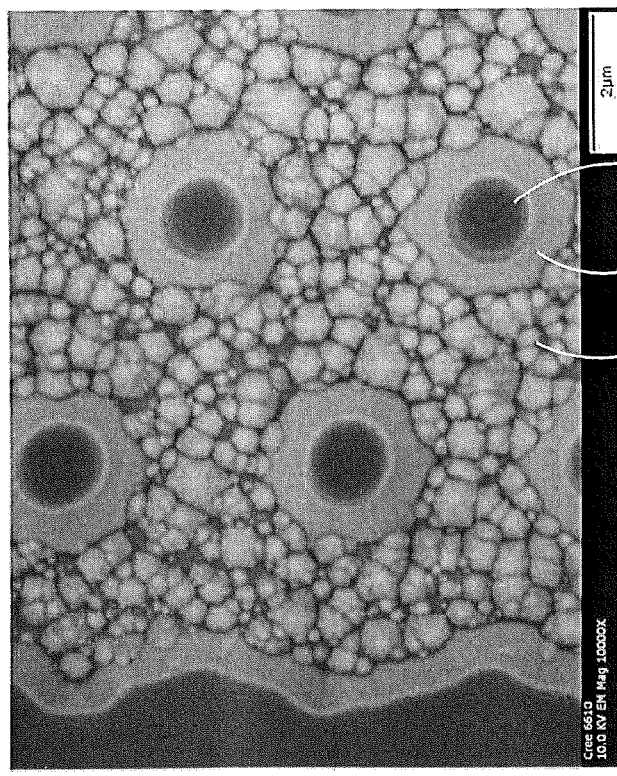
FIG. 7B
FIG. 7A

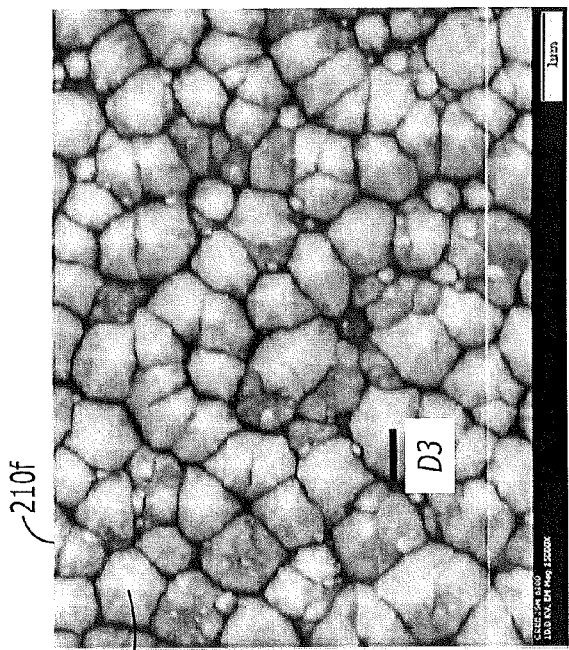
FIG. 10B
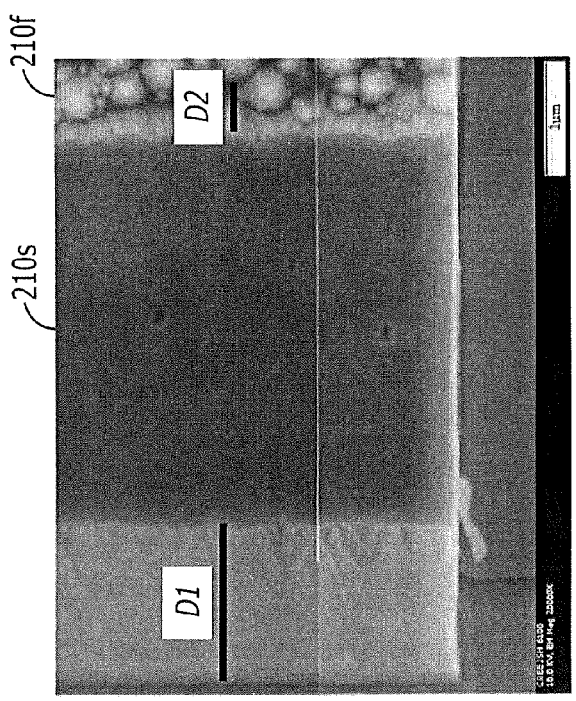
FIG. 10A
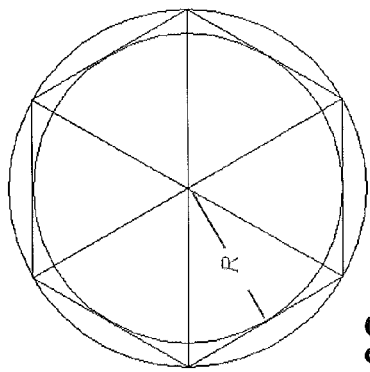
FIG. 10C
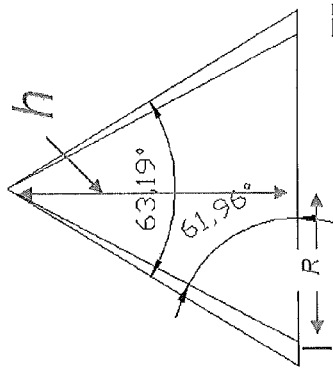

LIGHT EMITTING DIODES HAVING GROUP III NITRIDE SURFACE FEATURES DEFINED BY A MASK AND CRYSTAL PLANES

BACKGROUND

This invention relates to light emitting devices and methods of fabricating the same, and more particularly, to Light Emitting Diodes (LEDs) and methods of fabricating LEDs.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

The diode region of many LEDs is fabricated from Group III Nitride layers. Moreover, the LED may include a mesa that includes a Group III Nitride mesa face and a mesa sidewall, on an underlying LED structure. As used herein, the term "Group III Nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them. Moreover, the Group III Nitride compound may be doped p-type and/or n-type using, for example, p-type dopants such as magnesium and/or n-type dopants such as silicon. Finally, other elements may also be present in the Group III Nitride.

It is often desirable to texture a surface of a Group III Nitride layer in an LED, for example, to facilitate light extraction and/or for other purposes. A major advancement in texturing of a Group III Nitride surface is described in U.S. Pat. No. 8,357,923 to Edmond et al., entitled External Extraction Light Emitting Diode Based Upon Crystallographic Faceted Surfaces, the disclosure of which is hereby incorporated herein by reference in its entirety as if set forth fully herein. As described in the Abstract of U.S. Pat. No. 8,357,923: "A light emitting diode is disclosed that includes a support structure and a Group III nitride light emitting active structure mesa on the support structure. The mesa has its sidewalls along an indexed crystal plane of the Group III nitride. A method of forming the diode is also disclosed that includes the steps of removing a substrate from a Group III nitride light emitting structure that includes a sub-mount structure on the Group III nitride light emitting structure opposite the substrate, and thereafter etching the surface of the Group III nitride from which the substrate has been removed with an anisotropic etch to develop crystal facets on the surface in which the facets are along an index plane of the Group III nitride. The method can also include etching the light emitting structure with an anisotropic etch to form a mesa with edges along an index plane of the Group III nitride." See the Abstract of U.S. Pat. No. 8,357,923.

SUMMARY

An LED according to various embodiments described herein may comprise a mesa that comprises a Group III Nitride mesa face and a mesa sidewall, on an underlying LED structure. The LED also comprises an array of Group III Nitride truncated cones in the mesa face. In some embodiments, the Group III Nitride truncated cones have sides that extend along crystal planes of the Group III Nitride. As used herein, a "cone" is a three-dimensional geometric shape that tapers smoothly from a base to a point called the apex or vertex. The base may be elliptical, circular and/or polygonal. A cone with a polygonal base is often referred to as a "pyramid". A cone with its apex cut off by a plane is referred to as a "truncated cone" and a pyramid with its apex cut off by a plane is referenced to as a "truncated pyramid". Moreover, if the truncation plane is parallel to the cone's base, the truncated cone is called a "frustum". The opposing planar surfaces of a truncated cone or truncated pyramid are both referred to as a "base".

In some embodiments, the Group III Nitride truncated cones comprise elliptical, circular and/or polygonal bases. In some embodiments, the elliptical, circular and/or polygonal bases of adjacent truncated cones touch one another, and in some embodiments, form a hexagonal closest-packed structure. In other embodiments, the elliptical, circular and/or polygonal bases of adjacent truncated cones are spaced apart from one another, and in some embodiments a plurality of non-truncated cones and/or other texturing features are provided between the adjacent truncated cones that are spaced apart from one another. The non-truncated cones and/or other texturing features between the adjacent truncated cones may be shorter than the adjacent truncated cones.

In still other embodiments, a transparent feature is provided on exposed (i.e., top or outer) bases of the Group III Nitride truncated cones. In yet other embodiments, the exposed bases of the Group III Nitride truncated cones are textured.

An LED according to various other embodiments described herein comprises a mesa that comprises a Group III Nitride mesa face and a mesa sidewall, on an underlying LED structure. The mesa face comprises therein a plurality of Group III Nitride surface features comprising tops defined by mask features, comprising bottoms, and comprising sides that extend between the tops and the bottoms along crystal planes of the Group III Nitride. As used herein, a "top" of the surface feature is remote from the underlying LED structure and a "bottom" of the surface feature is adjacent the underlying LED structure. In some embodiments, the mask features comprise a two-dimensional array of dots that are spaced apart from one another. The dots may comprise elliptical, circular and/or polygonal dots. In some embodiments, a size and/or pitch of the dots are configured so that at least some of the Group III Nitride surface features touch one another. In other embodiments, the size and/or pitch of the dots are configured so that at least some of the Group III Nitride surface features are spaced apart from one another.

In some embodiments, the mask features comprise transparent mask features. In other embodiments, the Group III Nitride features are produced using a wet chemical etch through the mask features.

In some embodiments, the bottoms of the plurality of Group III Nitride surface features cover at least about 35%, and in some embodiments at least about 50%, in other embodiments at least about 90%, and in still other embodiments substantially all, of an area of the Group III Nitride mesa face. Moreover, in yet other embodiments, an aspect ratio of a height of the Group III Nitride surface features to the bottom of the Group III Nitride surface features is at least about 0.2 in some embodiments, at least about 0.3 in other embodiments, and at least about 0.4 in still other embodiments. In yet other embodiments, a height of the Group III Nitride surface features is less than about 50% of a thickness of the Group III Nitride layer that is included in the mesa. In still other embodiments, the bottoms of the Group III Nitride surface features touch one another and a height of the Group III Nitride surface feature exceeds about 1 μm in some embodiments and is between about 1.5 μm and about 3 μm in other embodiments. The thickness of the Group III Nitride layer that is beneath the bottoms of the plurality of Group III Nitride surface features may also exceed at least about 1 μm in some embodiments and at least about 2 μm in other embodiments. Finally, in still other embodiments, an angle between the side and the bottom of the Group III Nitride surface features is between about 45° and about 75° in some embodiments, and is about 62° in other embodiments. It will also be understood that various embodiments described above related to area coverage, aspect ratio, angle and height of the Group III Nitride surface features may be combined in various combinations and subcombinations.

Methods of fabricating an LED having a Group III Nitride face may be provided according to other embodiments described herein, by masking the Group III Nitride face with a two-dimensional array of mask features that are spaced apart from one another, and wet chemical etching the Group III Nitride face that is exposed by the two-dimensional array of mask features that are spaced apart from one another. In some embodiments, the two-dimensional array of mask features that are spaced apart from one another comprises a two-dimensional array of dots that are spaced apart from one another. The dots may comprise elliptical, circular and/or polygonal dots.

In some embodiments, the mask features may comprise transparent mask features. Moreover, in some embodiments, the wet etching comprises wet chemical etching the Group III Nitride face that is exposed by the two-dimensional array of mask features that are spaced apart from one another to produce Group III Nitride features having sides that extend along crystal planes of the Group III Nitride.

BRIEF DESCRIPTION OF THE DRAWINGS

FIGS. 4, 5A-5D, 6A-6D, 7A-7B and 8A-8C are Scanning Electron Microscope (SEM) photographs of LEDs according to various embodiments described herein.

FIGS. 10A and 10B are SEM photographs of an LED according to various embodiments described herein.

FIG. 10C illustrates geometric relationships of truncated cones according to various embodiments described herein.

DETAILED DESCRIPTION

Figure 1:
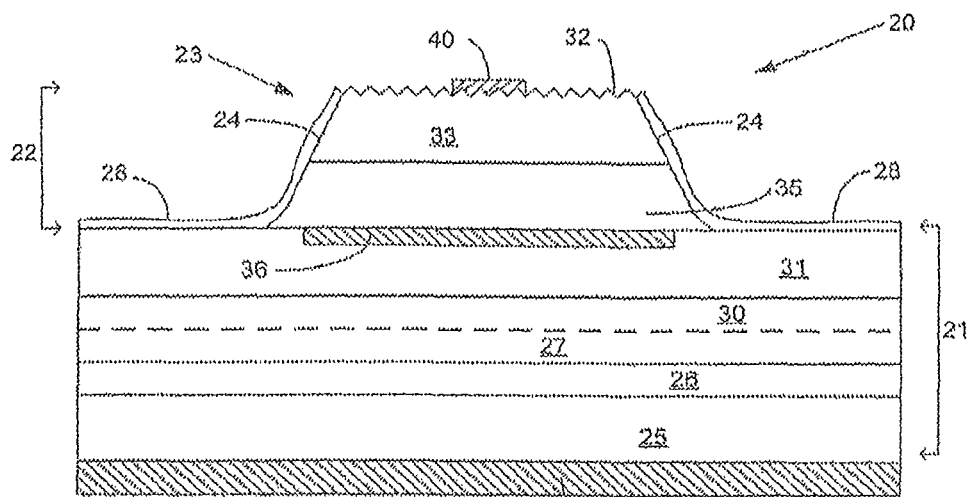
FIG. 1 is a reproduction of FIG. 1 of U.S. Pat. No. 8,357,923.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Spatially relative terms, such as "beneath," "below," "lower," "above," "upper" and the like, may be used herein for ease of description to describe one element or feature's relationship to another element(s) or feature(s) as illustrated in the figures. It will be understood that these terms are intended to encompass different orientations of the device in addition to the orientation depicted in the figures. Finally, the term "directly" means that there are no intervening elements. In all cases, the terms "on", "directly", "overlies" and other spatially relative terms do not require that an element covers another element. As used herein, the term "and/or" includes any and all combinations of one or more of the associated listed items and may be abbreviated as "/".

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or otherwise structured to do so.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include any Group III Nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

FIG. 1 is a reproduction of FIG. 1 of the above incorporated U.S. Pat. No. 8,357,923. FIG. 1 is a schematic cross-sectional illustration of a prior art light emitting diode 20 that may be used with various embodiments described herein. It will be understood that a wide variety of other details about LEDs could be discussed, but are omitted from FIG. 1 for the sake of clarity.

The light emitting diode 20 includes a support or underlying structure which in FIG. 1 is indicated by the bracketing arrows 21, and a Group III Nitride light emitting active structure designated by the bracketing arrows 22, on the support or underlying structure 21. The active structure forms a mesa broadly designated at 23. In these embodiments, the mesa 23 has its sidewalls 24 along an indexed crystal plane of the Group III Nitride that forms the active structure.

The term "indexed crystal plane" is used in its well understood sense consistent with the law of rational indexes; i.e., for any crystal species there is a set of axes in terms of which all naturally occurring faces have reciprocal intercepts proportional to small integers. These integers are typically referred to in the format "(hid)" or (hkil) for hexagonal crystals (including gallium nitride). In describing a crystal plane, the set of integers chosen should be the simplest set of many possible choices and the simplest set is referred to as the Miller indexes of a crystal face. Planes that occur or develop naturally in crystals have a high surface density of lattice sites and these lattice sites are repeated regularly throughout three dimensions in a manner well understood in crystal science and terminology.

Those familiar with crystal structures will recognize, of course, that any crystal plane (face) can be described using the Miller Index system. Thus, a crystal face that is created by a mechanical process such as sawing the crystal or etching it in a plasma will have an appropriate set of (hkl) or (hkil) indexes that properly describes the plane. Nevertheless, such mechanically created planes are rarely referred to as indexed crystal planes, and are not referred to as such herein, because they do not represent reciprocal intercepts proportional to small integers. Instead, such planes represent intercepts that may be proportional to large integers ("17, 13, 7") that are unrelated to the naturally occurring faces of the particular crystal. As used herein, the minus sign ("−") is used in place of the "bar" convention to indicate an intercept on the negative axis.

In order to distinguish the indexed crystal planes, they are also referred to herein with the adjective phrase, "chemically developed," to represent that the faces have been produced using a wet chemical etch. The nature of the wet etch produces naturally occurring indexed crystal planes rather than planes that are uncharacteristic of the naturally occurring crystal. For example, the mesa sidewalls may fall within the {10-11} family of planes in hexagonal GaN, and specifically the (10-11), (1-101) and (0-111) planes along with the [−12-10] and [−1010] directions. In accordance with some embodiments described herein, the angle(s) relative to the support structure is determined by the indexed plane(s) obtained. The angle can be varied depending on the orientations of the growth substrate, the orientation of the mesa relative to the growth substrate (for example the rotation of the mesa in the growth plane) and/or the etching process. For example, where the mesa is made of GaN grown on a SiC substrate on the (0001) plane, the mesa sidewalls are at about 58° on one side and about 62° on an adjacent side. The angles can be made more or less symmetric and the asymmetry can be increased by changing one or more of the parameters mentioned above. In this manner, other angles (e.g. greater than 42°) can be achieved. Those of skill in the art will recognize that mesas of cubic GaN, or other materials with other crystal symmetry will demonstrate similar characteristics, but at other angles. Other crystal facet angles (mesa or sidewall) can be achieved with other materials or other crystal structures. In general, the mesa sidewalls form along indexed crystal planes of the mesa material, and in the illustrated embodiment, the sidewalls form an angle of between about 58 and 62 degrees with respect to the support structure.

In terms of characteristics, a chemically developed face is predominantly formed by a chemical reaction (as opposed to a partial or secondary reaction) between the etching composition and the gallium nitride. Thus, potassium hydroxide wet etching forms a chemically developed face. A "reverse CVD" process in which the gallium nitride is chemically etched by an appropriate gas may also form a chemically developed face. These chemically developed faces are naturally smooth on an atomic scale.

By comparison, chemically developed faces do not include those produced by sawing or by plasma etching even though some chemical reaction may occur between the plasma etch composition and the underlying crystal. Furthermore, dry (plasma) etching does not generate naturally occurring index faces. Dry etching also unfavorably induces damage in gallium nitride. Some of the damage physically absorbs light, while other damage causes point defects that can affect the electronic characteristics of the crystal and thus of the resulting device.

In some embodiments, the support or underlying structure 21 is either formed of a plurality of conductive layers or includes a conductive path so that when the diode 20 is mounted, for example on a lead frame, it will have a vertical orientation; i.e., the current that drives the diode will flow axially through the diode rather than laterally. In many circumstances, a vertical diode may offer advantages over a "horizontal" diode in that a vertical diode may present a smaller footprint than a horizontal one with the same emitting area. In some embodiments, the support structure 21 can include a plurality of elements. These can include (as illustrated) a substrate 25, barrier layer 26 and 31, and metal bonding layers 27 and 30. Such sub-mount structures are described in detail in U.S. Pat. No. 6,740,906, to Slater, Jr. et al., entitled Light Emitting Diodes Including Modifications For Submount Bonding, the disclosure of which is hereby incorporated herein by reference in its entirety as if set forth fully herein.

These plurality of layers are examples of diodes that are prepared and mounted in what is referred to as "flip-chip" orientation. Although various embodiments are described herein in the flip-chip context, the invention is not limited to the flip-chip orientation.

In the embodiment illustrated in FIG. 1, an emitting face 32 of the diode 20 is a Group III Nitride surface of the active structure 22.

The illustrated light emitting structure 22 is formed of a top (terminating) layer of n-type type gallium nitride 33 with the nitrogen face exposed and a p-type layer of gallium nitride 35. The opposite conductivity layers 33 and 35 form a p-n junction for recombination purposes.

It will be understood that the light emitting structure can include a larger number of elements; for example, additional and/or intervening layers for various purposes including structures such as multiple quantum wells and/or superlattice structures. Because both these more complex structures and the more basic structure illustrated in FIG. 1 can be used in accordance with the present invention, these other structures will not be discussed in detail. Other etchants could be developed for the gallium face, non-polar or semi-polar faces.

It will also be understood that although FIG. 1 is described in terms of gallium nitride (GaN), the structure is consistent with ternary and quaternary Group III Nitrides; e.g., AlGaN, InGaN, and AlInGaN. With respect to the various embodiments described herein, these material systems are well-understood.

As set forth in previously-referenced U.S. Pat. No. 6,740,906, the support structure 21 may comprise metal, semiconductor, and combinations of metals and semiconductors. In other embodiments, insulators also may be included.

In the example embodiment illustrated in FIG. 1, the gallium nitride layers 33 and 35 terminate in the indexed crystal plane sidewalls 24 of the mesa 23. The mesa sidewalls fall along the (hkil) crystal plane of gallium nitride based upon the manner in which the diode is manufactured.

FIG. 1 also illustrates a mirror 36 positioned adjacent the light emitting structure 22 but opposite the emitting surface 32 to enhance light extraction from the diode 20.

FIG. 1 also illustrates that in various embodiments the light emitting surface 32 of the diode 20 is similarly crystallographic; i.e., formed of a plurality of crystal features that demonstrate indexed planes of the Group III Nitride. In particular, as shown in FIG. 1, the crystal planes of the crystallographic surface 32 correspond (i.e., are congruent in the geometric sense) to the crystal planes of the mesa sidewalls 24, for example when they are formed using the same or similar etchant and/or process. One of the crystal planes appears to be dominant, but other planes may appear as well.

The light emitting diode 20 also includes an ohmic contact 37 to the support structure 21 and an ohmic contact 40 to the active structure 22. In some embodiments, the ohmic contact 40 is made to the crystallographic textured surface 32 while in other embodiments a planar surface is provided for the contact 40. Forming the ohmic contact 40 on a roughened surface, such as the crystallographic textured surface 32, may provide an improved physical and/or electrical connection between the contact 40 and the active structure 22. A passivation layer 28 is typically included to provide both electrical isolation and environmental protection. The passivation layer is typically formed of silicon dioxide, stoichiometric silicon nitride, nonstoichiometric silicon nitride and/or other materials.

Because of their small size (LED chips of this type are typically about 200-1000 microns along one side), in many manufacturing techniques, diodes such as the illustrated diode 20 are formed as a plurality of mesa structures on a common wafer rather than individually.

It will be understood that FIG. 1 illustrates a so-called vertical LED in which the contacts are on opposite sides of the device. FIG. 1 may embodied by Cree EZ500, EZ600, EZ900, EZ1000 and EZ1400 LEDs, as described in the Data Sheets entitled "Cree® EZ500™ Gen II LED" (Data Sheet: CPR3EB Rev., 2009), "Cree® EZ600™ Gen II LED" (Data Sheet: CPR3EE Rev. A, 2010), "Cree® EZ900™ Gen II LEDs" (Data Sheet: CPR3DX Rev. B, 2008-2011), "Cree® EZ1000™ Gen II LEDs" (Data Sheet: CPR3EC Rev. A, 2009) and "Cree® EZ1400™ Gen II LEDs" (Data Sheet: CPR3EK Rev., 2010), the disclosures of which are hereby incorporated herein by reference in their entirety as if set forth fully herein. In other embodiments, the contacts may both be on the same side of the device, as described, for example in U.S. Patent Application Publication 2009/0283787 to Donofrio et al., entitled Semiconductor Light Emitting Diodes Having Reflective Structures and Methods of Fabricating the Same, the disclosure of which is hereby incorporated herein by reference as if set forth fully herein. LEDs having contacts on the same side of the device may be embodied by Cree DA3547™, DA700™, DA2432™ and DA1000™ LED chips, as described in Data Sheets entitled "Direct Attach DA3547™ LEDs" (Data Sheet: CPR3EL Rev. A, 2010), "Direct Attach DA700™ LEDs" (Data Sheet: CPR3EU Rev., 2011), "Direct Attach DA2432™ LEDs" (Data Sheet: CPR3FM Rev, 2011), and "Direct Attach DA1000™ LEDs" (Data Sheet: CPR3ES Rev. A, 2010), the disclosures of which are hereby incorporated herein by reference in their entirety as if set forth fully herein. Various other configurations of LEDs may be provided that have a Group III Nitride face.

Various embodiments described herein can provide a Group III Nitride surface that can improve light extraction, using the combination of a photolithographically defined mask, such as a transparent dielectric mask, and wet etching. Various embodiments described herein may produce a more consistent surface, as compared with embodiments described in U.S. Pat. No. 8,357,923.

Specifically, texturing of a Group III Nitride surface can be a difficult process to control due to the random nature of the process and/or electrochemical influences that are beyond process control. Moreover, the polarity of the surfaces exposed during the etch, the area of the surfaces, as well as other factors related to the Group III Nitride layer itself can cause a wide variation in texture depth, crystal feature size and amount of Group III Nitride removed in a given time period. This can create large variations within a wafer that is used to fabricate multiple LEDs, and/or from wafer-to-wafer, in production. Moreover, over-etching and/or under-etching can cause issues with device performance, such as decreased radiant flux, increased leakage rates and/or reliability issues.

In sharp contrast, various embodiments described herein can provide a combination of textured and untextured areas that can be defined on a scale that can provide features with aspect ratios and angled sidewalls that allow enhanced light extraction in a controlled manner. Thus, various embodiments described herein can improve performance averages, increase yields and/or reduce reliability risk in LEDs.

Figure 2A:
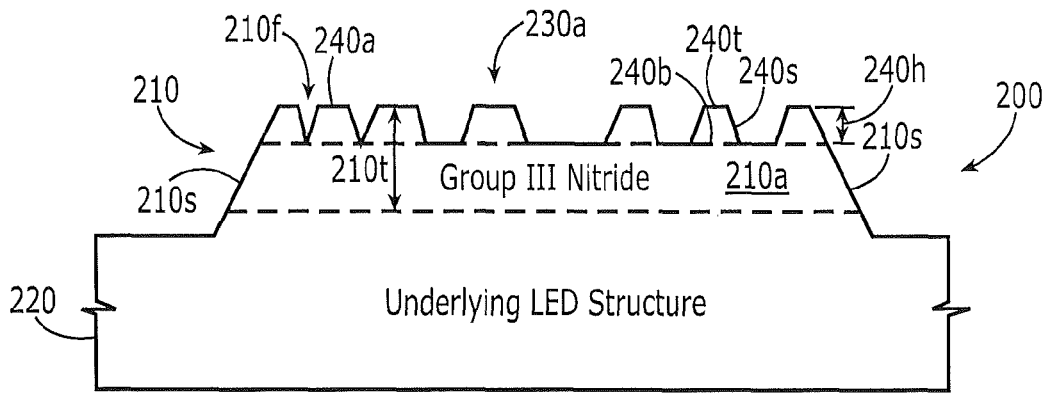
FIGS. 2A-2F are cross-sections of LEDs according to various embodiments described herein.

FIG. 2A is a cross-sectional view of an LED according to various embodiments described herein. As shown in FIG. 2A, these LEDs 200 include a Group III Nitride layer 210 on an underlying or supporting LED structure 220. The Group III Nitride layer 210 may form a mesa relative to the underlying LED structure 220. The Group III Nitride layer or mesa 210 includes a mesa or layer face 210$f$ and a mesa or layer sidewall 210$s$ on the underlying LED structure 220. A dashed line is shown between the layer or mesa 210 and the underlying LED structure 220, because the boundary between these elements may be within the mesa 210, at the boundary between the mesa 210 and the underlying LED structure 220, or in the underlying LED structure 220. Stated differently, in some embodiments, the entire mesa 210 may comprise one or more Group III Nitride layers and the underlying LED structure 220 may also comprise one or more Group III Nitride layers. In other embodiments, the underlying structure may also include other semiconductor or non-semiconductor (conductor or insulator) substrates or layers, and in some embodiments may not include a Group III Nitride layer.

Still referring to FIG. 2A, an array 230$a$ of Group III Nitride surface features 240$a$, which may be in the form of truncated cones 240$a$ is provided in the layer or mesa face 210$f$. The surface features 240$a$ may all be of same size and shape and may all lay on the same pitch, in some embodiments. In other embodiments, as shown in FIG. 2A, the cones may be of different sizes and have different spacing therebetween. Stated differently, the array 230$a$ may be a two-dimensional array of truncated cones 240$a$ that extends in two different directions on the Group III Nitride layer or mesa face 210$f$, such as in two orthogonal directions, and may be spaced uniformly, non-uniformly according to a predefined pattern and/or randomly in either direction in the face 210$f$. The pattern in the array 230$a$ may be configured to provide a desired light emission pattern from the LED 200 and/or may be configured to provide a visible indicia, such as a marking including a geometric figure such as a square, an alphanumeric symbol such as the letter "A", a logo or other marking on the LED, when viewed with the naked eye or under magnification.

The Group III Nitride truncated cones 240$a$ may include elliptical, circular and/or polygonal top and/or bottom bases. In some embodiments, the elliptical, circular and/or polygonal bases of adjacent truncated cones 240$a$ touch each other, as shown at the left side of FIG. 2A, and in other embodiments, the elliptical, circular and/or polygonal bases of adjacent truncated cones 240$a$ are spaced apart from one another, as shown at the center and right side of FIG. 2A.

Figure 2B:
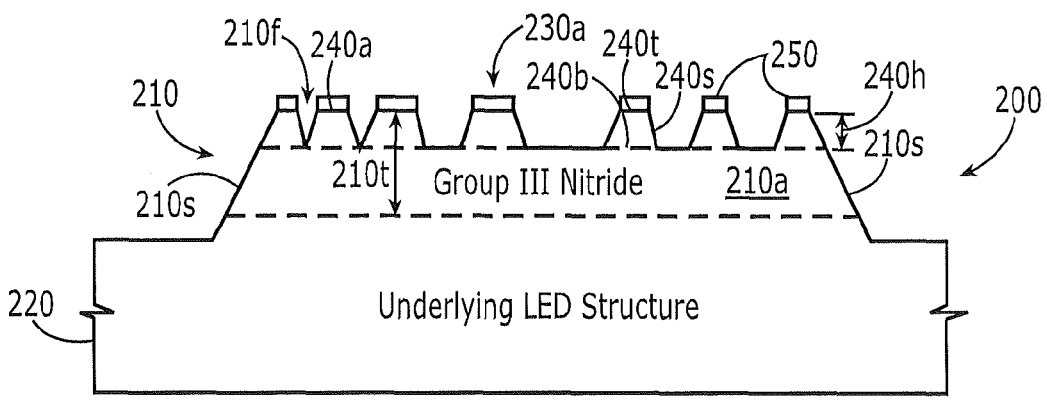

Still referring to FIG. 2B, the surface features 240$a$ include a top 240$t$ that is remote from the underlying LED structure 220, a bottom 240$b$ that is adjacent the underlying LED structure 220 and one or more sides 240$s$ that extend between the top 240$t$ and the bottom 240$b$ along crystal planes of the Group III Nitride layer or mesa 210. The surface features 240$a$ also include a height 240$h$ that is defined by the smallest distance between the top 240$t$ and the bottom 240$b$. The top 240$t$ and the bottom 240$b$ may also be generically referred to as a "base" of the Group III Nitride surface feature 240$a$. In a truncated cone, the bases are of different sizes. Finally, the Group III Nitride layer or mesa 210 also includes a thickness 210$t$ that is defined from the tops 240$t$ of the surface features 240 to the bottom of the Group III Nitride layer or mesa 210.

FIG. 2B illustrates other embodiments wherein a transparent feature 250, such as a transparent mask, is provided on the exposed bases (i.e., the top 240$t$ or outer bases) of the Group III Nitride truncated cones 240$a$. The transparent feature 250 may be a mask that is used to etch the array of Group III Nitride truncated cones 240$a$ in the mesa face, as will be described in detail below. The transparent feature 250 may comprise silicon nitride that is about 0.5 μm thick in some embodiments, and between about 100 Å and about 1 μm thick in other embodiments.

FIG. 2B may also be regarded as illustrating the layer or mesa face 210$f$ including therein a plurality of Group III Nitride surface features 240$a$ having tops 240$t$ that are defined by mask features 250. As will be described in detail below, in some embodiments, the mask features 250 comprise a two-dimensional array of dots that are spaced apart from one another. The dots may be elliptical, circular and/or polygonal dots. The dots may be solid or may have one or more openings therein. A size and/or a pitch of the dots 250 may be configured so that at least some of the Group III Nitride surface features 240$a$ touch one another and/or so that at least some of the Group III Nitride surface features 240$a$ are spaced apart from one another. In some embodiments, the mask features 250 comprise transparent mask features. In other embodiments, reflective mask features may be provided in addition to or instead of transparent mask features. The transparent mask features 250 may be shaped so as to provide one or more microlenses and/or other optical element(s) on the exposed face of the texturing features 240$a$. As will be described in detail below, the Group III Nitride features 240$a$ may be produced using a wet chemical etch through the two-dimensional array of mask features 250 that are spaced apart from one another.

Figure 2C:
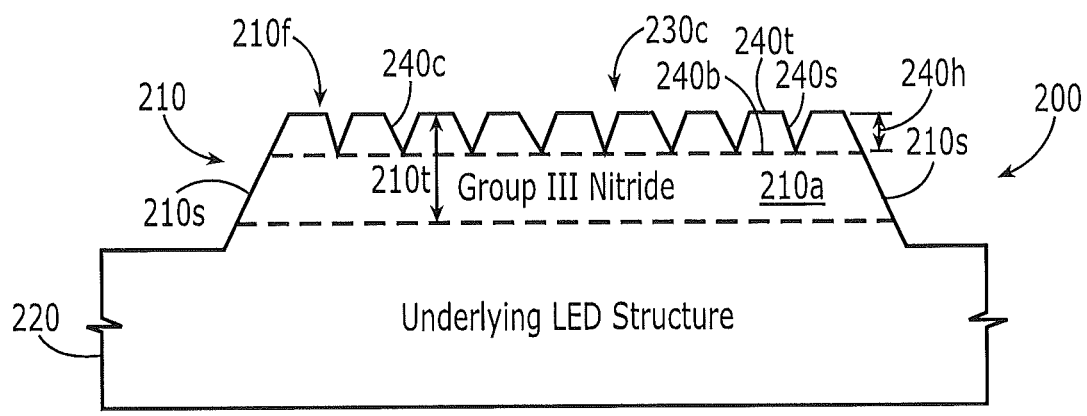
Figure 2D:
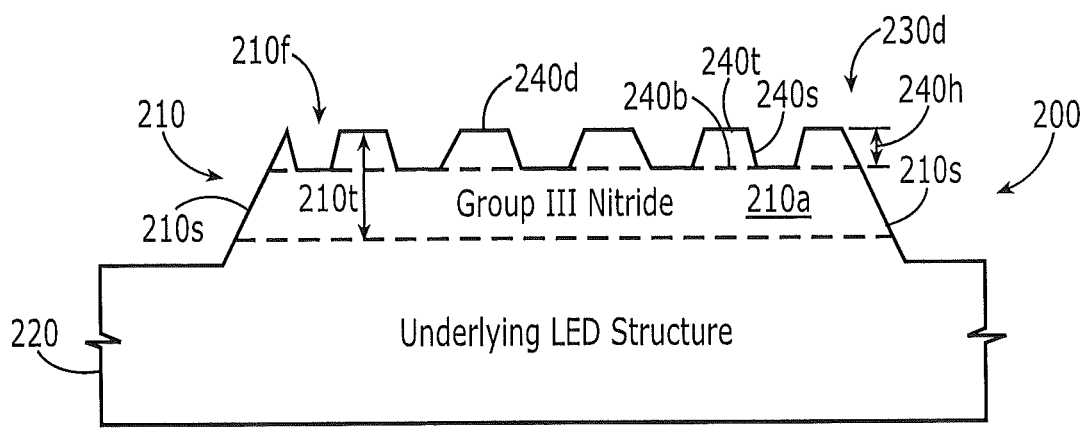

FIG. 2C illustrates other embodiments of LEDs 200 wherein the adjacent truncated cones 240$c$ touch one another. FIG. 2D illustrates other embodiments of LEDs wherein the adjacent truncated cones 240$d$ are spaced apart from one another.

Figure 2E:
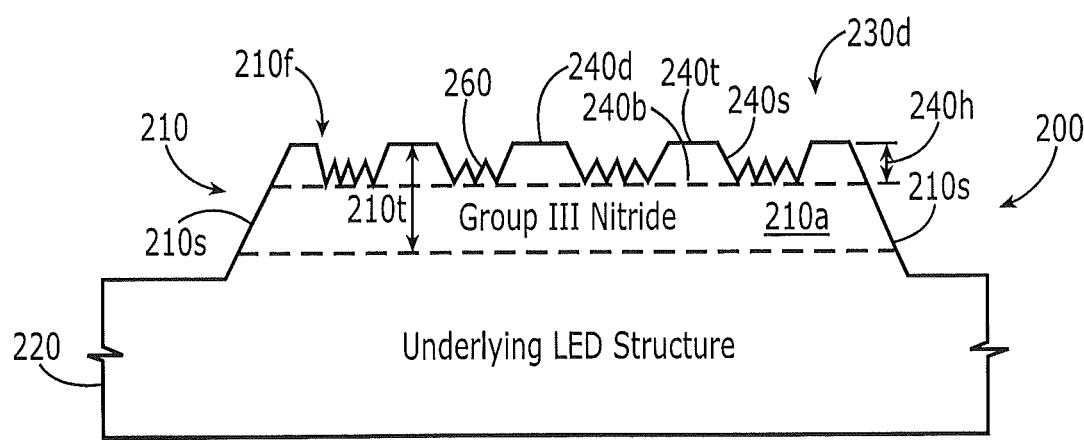

FIG. 2E illustrates yet other embodiments wherein the elliptical, circular and/or polygonal bases of adjacent truncated cones 240$d$ are spaced apart from one another, and that also includes a plurality of non-truncated cones (i.e., cones having a base and an apex) and/or other texturing features 260 between adjacent truncated cones 240$d$ that are spaced apart from one another. As illustrated in FIG. 2E, the non-truncated cones and/or other texturing features 260 between the adjacent truncated cones 240$d$ are shorter than the adjacent truncated cones 240$d$. The texturing features 260 may comprise random crystallographic features in some embodiments.

Figure 2F:
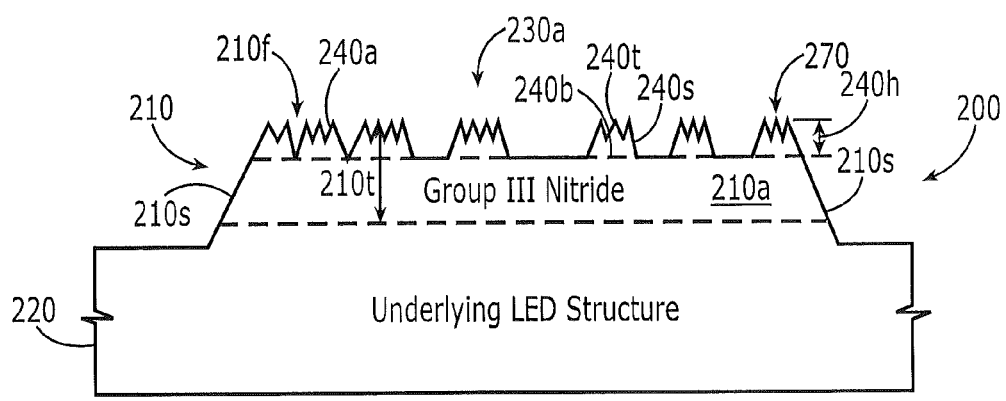

FIG. 2F illustrates other embodiments wherein the exposed (outer or top) bases of the Group III Nitride truncated cones 240$a$ are textured, as shown at 270. The texturing 270 extends less deep into the face 210$f$ than the truncated cones 240$a$. The texturing 270 may comprise random crystallographic features in some embodiments.

In any of the embodiments of FIGS. 2A-2F, the Group III Nitride truncated cones 240 may have sides that extend along crystal planes of the Group III Nitride mesa or layer 210.

The size, pitch, spacing, angle and other geometric configuration of the mask features 250 may be used to define the geometric configuration of the Group III Nitride surface features 240$a$, to provide a desired result. For example, the mask features 250 may be designed to provide a desired minimum coverage of the surface features over the area of the face 210$f$ of the Group III Nitride layer or mesa 210. For example, in some embodiments, the bottoms 240$b$ of the plurality of Group III Nitride surface features 240$a$ cover at least about 35% of the area of the Group III Nitride mesa face 210$f$ (i.e., the planar area of the mesa face 210$f$ before forming the Group III Nitride surface features 240a therein). In other embodiments, at least about 50% or at least about 75% of the area of the Group III Nitride mesa face is covered, and in still other embodiments, at least 90% of the area of the Group III Nitride mesa face may be covered. In the maximum case, the bottoms 240b of the plurality of Group III Nitride surface features 240a cover about 100% of the Group III Nitride mesa 210f, as illustrated schematically in FIG. 2C. Stated differently, the adjacent bases 210b may touch. These embodiments can provide enhanced light extraction compared to random texturing that was described in the above-cited U.S. Pat. No. 8,357,923.

In addition or alternatively, a lower limit may be provided on the aspect ratio of the Group III Nitride surface features 240a, i.e., a ratio of a height 240h to the bottom 240b of a Group III Nitride surface feature 240a. The lower limit may be a function of the starting thickness of the Group III Nitride layer or mesa 210, since the ratio of the top-to-bottom area is a factor in the extraction efficiency, based on, for example, results that were obtained from beveled silicon carbide chips, particularly if the top surface 240t is left planar, as in a truncated cone. Since the crystal plane angles are fixed, a lower limit in the aspect ratio in at least one axis may be provided. In some embodiments, the aspect ratio of the height 240h of the Group III Nitride surface features 240a to the bottom 240b of the Group III Nitride surface features is at least about 0.2, at least about 0.3 in other embodiments, and at least about 0.4 in still other embodiments. It will be understood that the size of the bottoms 240b is defined as the diameter of the circle when the bottom is a circle, the diameter of an inscribed circle when the bottom is hexagonal, or a shortest distance of the bottom in the shortest axis when gridlines, rectangles or other shapes are used. Moreover, the height 240h may be defined from the top 240t to the bottom 240b. Moreover, when a second etch is done to roughen the flat top 240t as was illustrated in FIG. 2F, the tops of the tallest random pyramid 270 will define the top.

In addition or alternatively to the area coverage and/or aspect ratio embodiments described above, a limit may be placed on the height 240h of the Group III Nitride surface features 240a relative to the thickness 210t of the Group III Nitride layer 210 that is included in the mesa. Thus, in some embodiments, a height 240h of the Group III Nitride surface features 240a is less than about 50% of a thickness 210t of the Group III Nitride layer 210 that is included in the mesa along at least one axis.

In addition or alternatively to the area coverage, aspect ratio and/or thickness percentage, for a self-limiting approach that is illustrated in FIG. 2C, the upper limit may be expressed relative to the thickness of the Group III Nitride layer or mesa 210, to avoid going too deep into this layer. Since epitaxial regions can typically be grown thicker on sapphire, this may allow increased spacing of mask features and deeper etch depth. Accordingly, various embodiments may provide an absolute limitation for the untextured thickness of the GaN layer 210 under the mask features 240a. For example, in some embodiments, the bottoms 240b of the Group III Nitride surface features 240a touch one another, as illustrated in FIG. 2C, and the height 240h of the Group III Nitride surface features 240a exceed about 1 µm in some embodiments, 1.5 µm in other embodiments and 2.0 µm in still other embodiments. In general, it may be desirable to have at least about 1-2 µm of the Group III Nitride layer 210a remaining under the Group III Nitride surface features 240a. Thus, in some embodiments, the mesa 210 includes a Group III Nitride layer 210a that is at least about 1 µm thick, and in some embodiments at least about 2 µm thick, beneath the bottoms 240b of the plurality of Group III Nitride surface features 240a. For either the self-intersecting features or the spaced features with random texturing inbetween, the height 240h may be between about 1.5 µm and about 3 µm in some embodiments. This may be obtained using 1.5 µm diameter dots on a 3 µm pitch, to have the crystal planes intersect at about a 1.5 µm depth.

Moreover, even larger heights 240h of the Group III Nitride surface features 240a may be provided when even thicker Group III Nitride layers 210 are provided. For example, if the growth substrate is not removed, the thickness 210t of the Group III Nitride layer 210 may be increased dramatically, thereby allowing a larger height 240h of the surface features 240a, while still allowing sufficient thickness of the Group III Nitride layer 210a that is beneath the bottoms 240b of the surface features 240a. Hybrid growth substrates that use a Group III Nitride template layer grown on another material may also allow additional thickness 210t of the Group III Nitride layer 210 when the base wafer is removed as well. The thickness of the portion 210a of the Group III Nitride layer 210 beneath the bases 240b of the surface features 240a may need to be controlled so as to provide a minimum thickness for current spreading and/or for reliability purposes, as there is a higher probability of cracking if the layer 210a is too thin. In some embodiments, the thickness of layer 210a may exceed about 1 µm, and in other embodiments may exceed about 2 µm. Thus, as long as these minimum thicknesses are provided beneath the surface features 240a, greater height 240h may be provided for the surface features 240a, if desired.

In addition or alternatively to the area coverage, aspect ratio, thickness percentage and/or height of the surface features, an angle between the side 240s and the bottom 240b of the Group III Nitride surface features 240a may be between about 45° and about 75° in some embodiments, and is about 62° in other embodiments. This angle may be based on the crystal planes of the Group III Nitride layer 210.

It will also be understood that various embodiments have been described above in terms of a truncated cone having a truncation plane that is parallel to the cone base, typically referred to as a "frustum". However, in other embodiments, the two bases of the truncated cone need not be parallel. Specifically, although some embodiments provide a right truncated cone, where the axis passes through the center of the bottom at right angles to its plane, other embodiments may provide an oblique truncated cone in which the axis does not pass perpendicular through the center of the bottom. For example, when the LED uses Group III Nitride, the Group III Nitride growth may follow an orientation of the growth substrate to at least some degree, so that if the wafers are fabricated slightly off axis, the resulting truncated cones may also have an angle variation from one side of the surface feature to the other, i.e., the cones will be tilted. Similarly, sapphire wafers are typically intentionally fabricated slightly off axis so that, again, right truncated cones may not be formed. Accordingly, the embodiments described herein should be construed as being limited to right truncated cones.

Figure 3A:
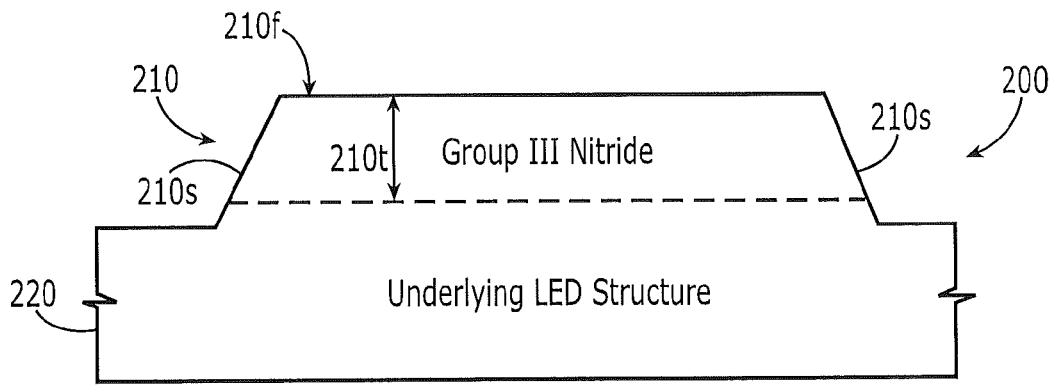
FIGS. 3A-3C are cross-sections of LEDs according to various embodiments described during fabrication thereof.
Figure 3B:
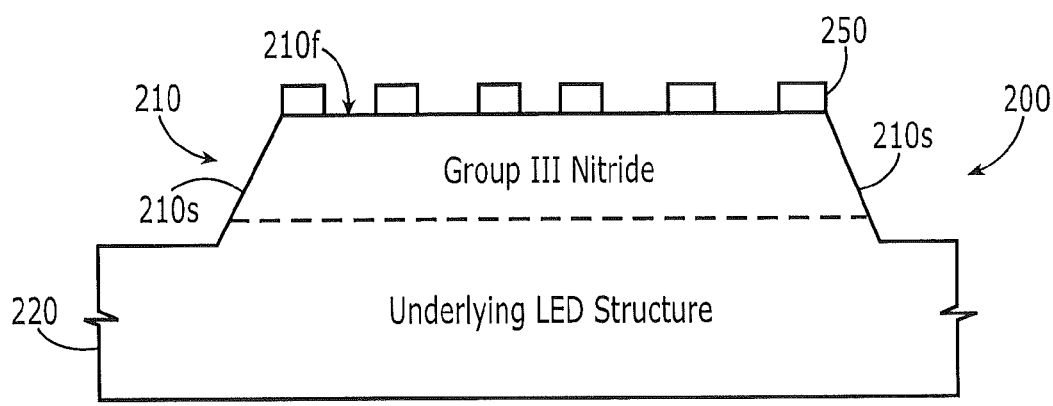
Figure 3C:
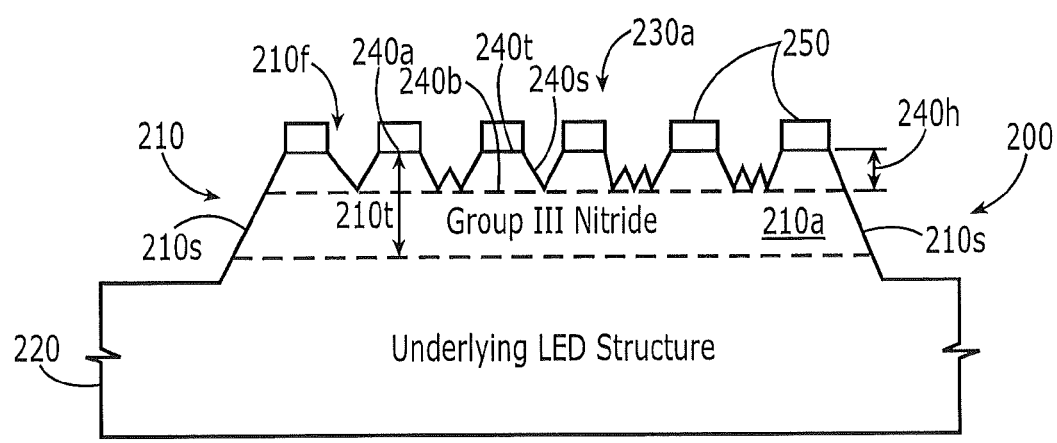

FIGS. 3A-3C are cross-sectional views of an LED according to various embodiments described herein during fabrication thereof. Referring to FIG. 3A, a Group III Nitride mesa 210 that includes a Group III Nitride face 210f is formed or provided on an underlying LED structure 220. In FIG. 3A, the mesa 210 is defined before forming the Group III Nitride truncated cones in the mesa face 210f. However, in other embodiments, the mesa 210 may be defined at the same time as and/or after, forming the truncated cones. For example, in the self-limiting embodiments of FIG. 2C, the mesa 210 and the surface features 240a may be defined using a single etching step. In particular, in the self-limiting embodiments of FIG. 2C, a relatively long etch time may be used to continue to etch the mesa 210 after the etching of the surface features 240a has been completed due to the self-limiting nature of the crystallographic etch.

Referring now to FIG. 3B, a two-dimensional array of mask features 250 is defined on the face 210f. For example, a mask material may be blanket deposited and then photolithographically patterned. Other conventional mask fabrication techniques may be used. In some embodiments, if the two-dimensional array of mask features 250 is later removed, the mask features may be opaque (absorbing). In other embodiments, when the two-dimensional array of mask features 250 is to remain on the final structure, they may be transparent. As used herein, the term "transparent" means that at least some of the radiation that is incident on the two-dimensional array of mask features 250 passes through the mask material of the two-dimensional array of mask features 250. In still other embodiments, the mask features may be reflective, meaning that at least some of the radiation that is incident thereon is reflected by the mask material of the two-dimensional array of mask features 250. The two-dimensional array of mask features 250 may comprise a single layer or multiple layers. As was noted above, the two-dimensional array of mask features 250 may also be used to define the mesa 210.

Then, referring to FIG. 3C, the Group III Nitride face 210f that is exposed by the two-dimensional array of mask features 250 is wet chemical etched, for example using KOH, to define the array of Group III Nitride truncated cones 240a in the mesa face 210f. Other wet chemical etchants may be used. Etching may take place at room temperature or at an elevated temperature. Other non-truncated cones or other texturing features 260 may also be defined, depending upon the size and or spacing of the two-dimensional array of mask features 250. In some embodiments, prior to performing the wet chemical etch of FIG. 3C, a shallow Reactive Ion Etch (RIE) using, for example, chlorine, may be performed to reduce damage to the mesa surface that was caused in forming the mask 250. Thus, a shallow RIE may be performed between the operations illustrated in FIGS. 3B and 3C.

Subsequent to the operations of FIG. 3C, the mesa may be defined if not defined earlier, and the two-dimensional array of mask features 250 may be shaped and/or fully removed. Texturing 270 of the exposed bases of the Group III Nitride truncated cones 240a may be provided, as was illustrated in FIG. 2F. Other subsequent processing of the LED may be performed.

It will also be understood that various combinations and subcombinations of the embodiments of FIGS. 2A-2F may be provided according to various embodiments described herein. For example, the transparent features or mask features 250, the features 260 and/or the features 270 may be provided in any of the embodiments of FIGS. 2A-2F. Moreover, although the mask features 250 have been illustrated and described as an array of spaced apart dots, many other embodiments may be provided. For example, the inverse of a two-dimensional array of dots may be provided by providing a mask having a two-dimensional array of holes therein that would then leave a grid of narrow, smooth areas after etching, which could be subsequently randomly textured.

A series of Scanning Electron Microscope (SEM) photographs will now be described to illustrate various embodiments described herein with respect of FIGS. 2-3.

Figure 4:
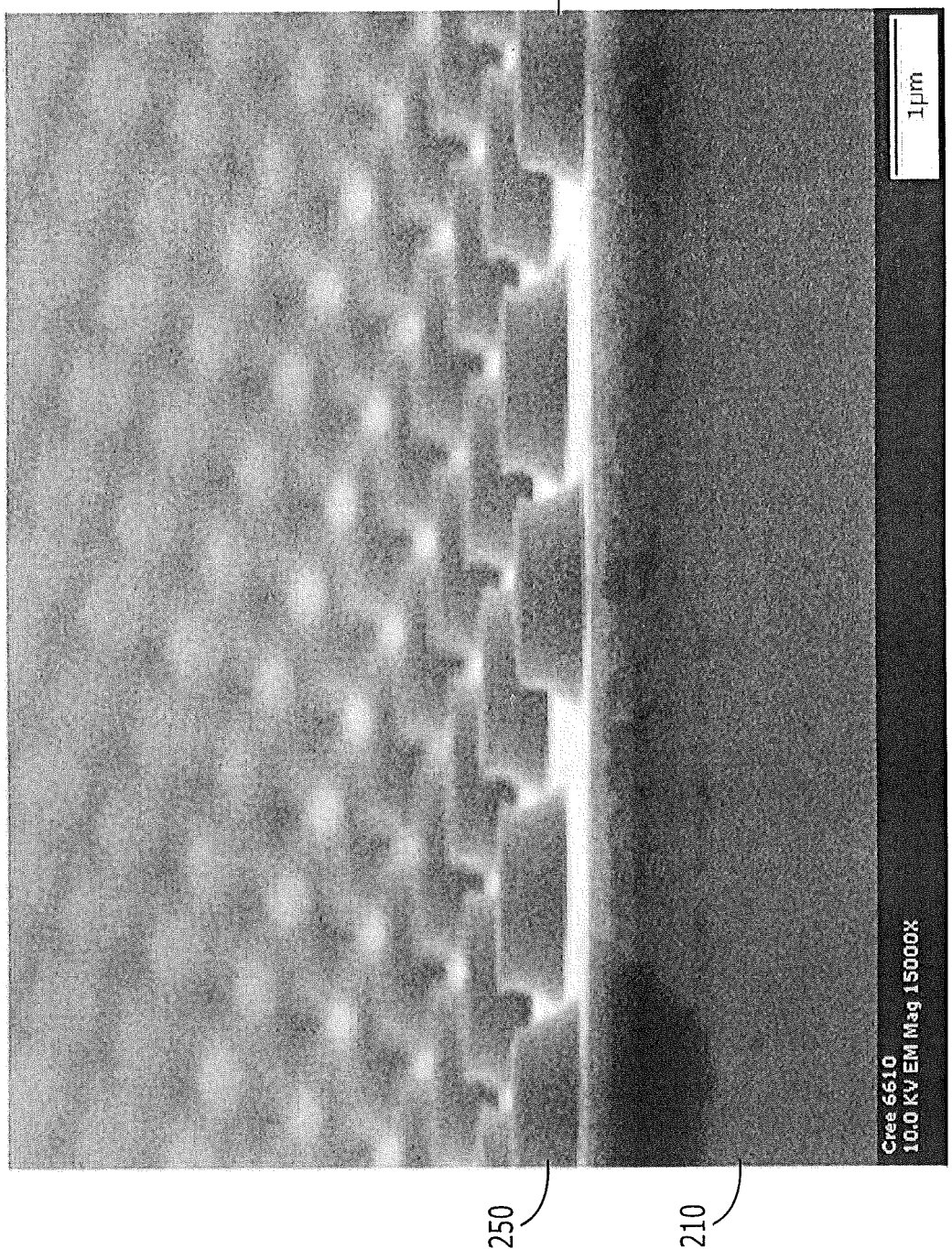

Specifically, FIG. 4 is an SEM that illustrates a two-dimensional array of mask features 250 on a gallium nitride mesa 210 prior to etching, as was illustrated in FIG. 3B. In FIG. 4, the mask features are circular dots of silicon nitride that are about 0.5 μm thick. The dots are circular, having a diameter of about 1.5 μm, and a pitch of about 3 μm.

Figure 5B:
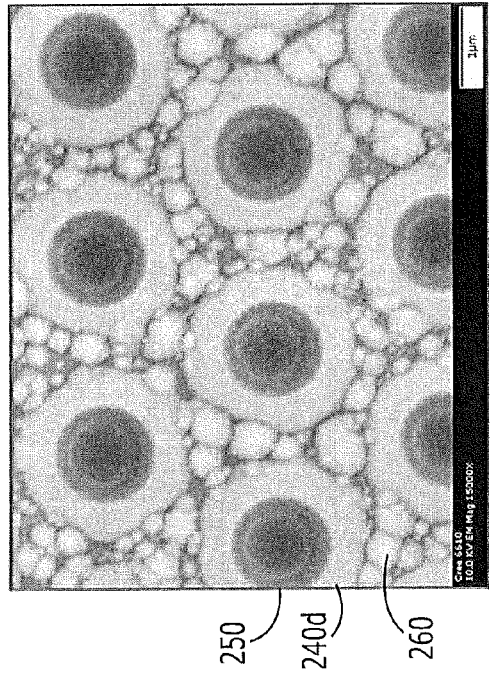
Figure 5A:
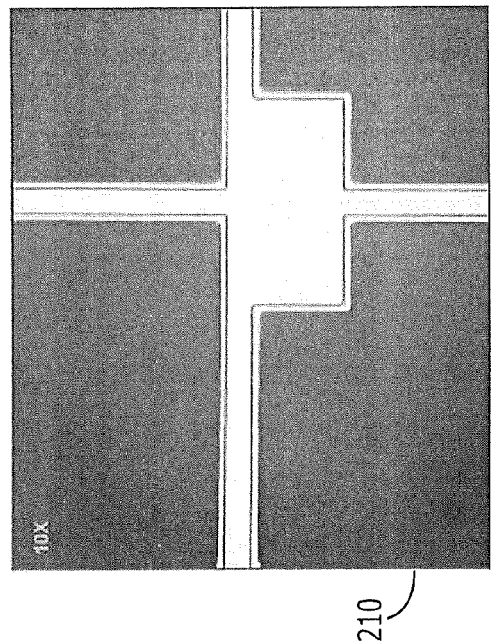
Figure 5C:
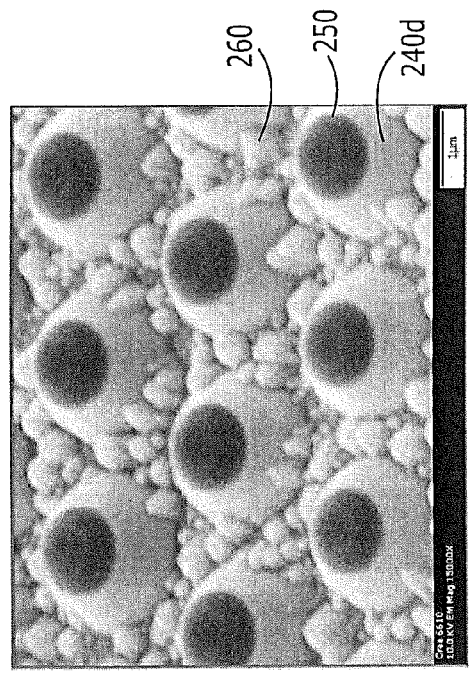
Figure 5D:
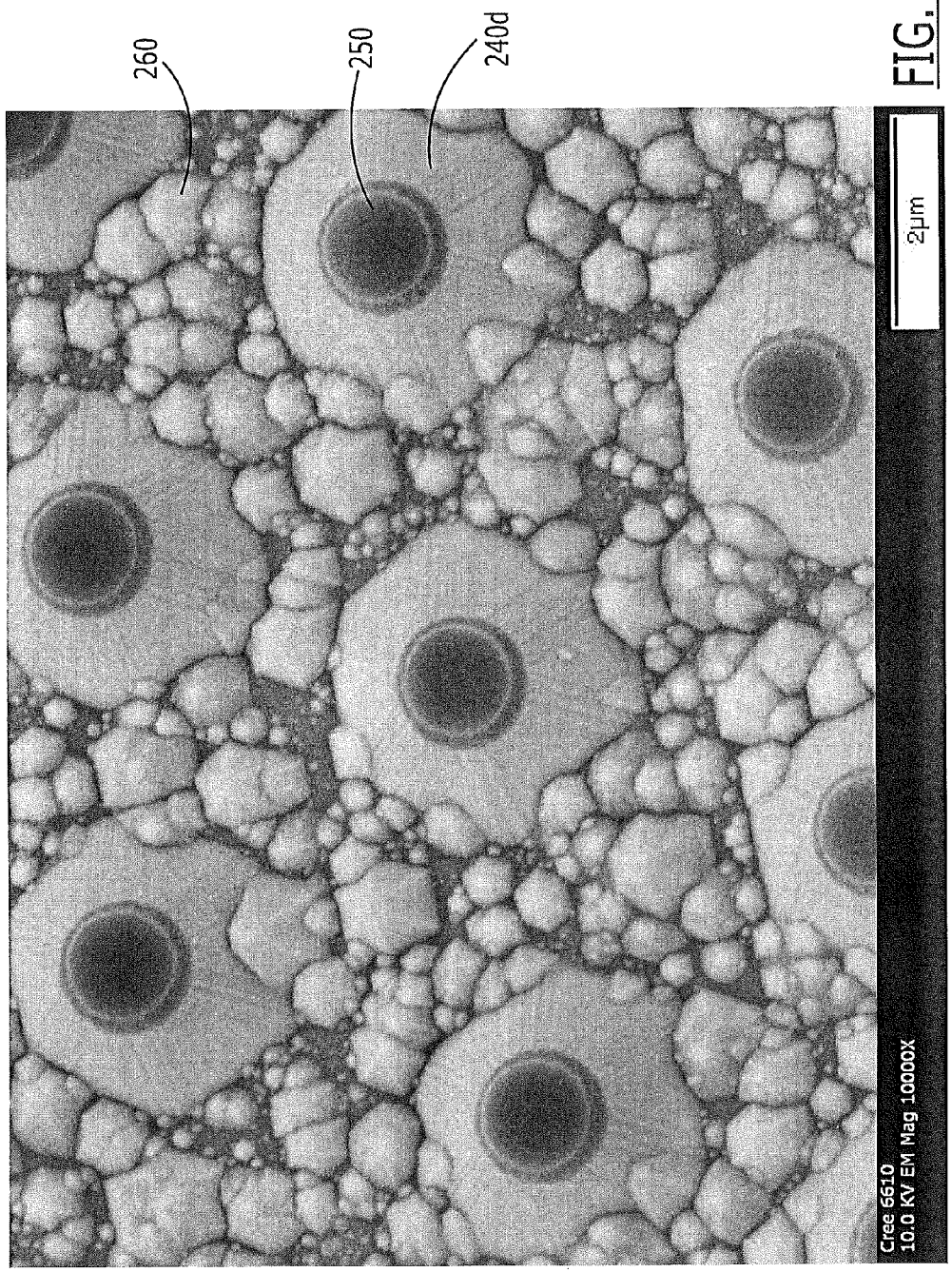

FIGS. 5A, 5B, 5C and 5D also illustrate 1.5 μm diameter circular dots 250 on a 3 μm pitch. FIG. 5A illustrates the mesa structures 210 at very low magnification. FIGS. 5B and 5C are top and perspective views, respectively, illustrating that the size and pitch of the dots 250 are configured so that at least some of the adjacent Group III Nitride surface texturing features 240d are spaced apart from one another, as was illustrated in FIG. 2E. Random cones or other texturing features 260 are also shown between the adjacent truncated cones 240d, that are shorter than the adjacent truncated cones 240d. The random cones or texturing features 260 may have a depth of less than about 0.5 μm. FIG. 5D is a higher magnification that shows the crystal planes on the sides.

Embodiments of FIGS. 5A-5D provide circular dots 250 having a diameter of about 1.5 μm on a pitch of about 3 μm. Thus, the mask was designed so that planes will intersect and self-limit at about 1.5 μm depth of the mesa if desired. However, in FIGS. 5A-5D, etching is terminated before the cones touch one another, for example by providing an etching of about 14 minutes, so that a truncated cone height of about 1.09 μm is provided. Thus, the truncated cones 240d do not touch one another and random texturing in the form of non-truncated cones or other texturing features 260 is provided between the adjacent cones.

In contrast, FIGS. 6A-6D illustrate embodiments wherein a size and/or pitch of the dots is configured so that at least some of the Group III Nitride surface features touch one another, as was illustrated, for example, in FIG. 2C. As illustrated in FIGS. 6A-6C, 1.5 μm dots 250 are placed on a 3 μm pitch. Thus, the mask is designed so that the truncated cones will intersect and self-limit at about 1.5 μm deep in the mesa.

The results of FIGS. 6A-6C were provided using the same 14 minutes of wet etching that was described in connection with FIGS. 5A-5C, and then providing an additional 20 minutes of wet etching, to provide a truncated cone height of about 1.34 μm, so that the adjacent cones 240c touch. Finally, as shown in FIG. 6C, the adjacent truncated cones 240c that touch one another form a hexagonal closest-packed structure. It will be understood that if the dots 250 were made smaller and/or the pitch was made larger, the additional 20 minutes etch could have resulted in deeper features if the adjacent truncated cones did not touch. FIG. 6D is a higher magnification that shows the crystal planes on the sides.

FIGS. 7A and 7B illustrate other embodiments that were illustrated in FIG. 2E. As illustrated in FIGS. 7A and 7B, 2 μm diameter circular dots 250 are provided on a 5 μm pitch, so that the truncated cones 240d do not touch. A plurality of cones, such as random cones and/or other texturing features 260 are provided between adjacent truncated cones 240d that do not touch one another.

FIG. 7B also illustrates that the array of Group III Nitride truncated cones 240d may be continued up to the mesa sidewall 210s, so as to provide the appropriate crystal plane structure at the edge of the mesa 210. Thus, in FIG. 7B, the edge of the mesa face 210f is scalloped rather than straight, to account for the array of Group III Nitride truncated cones 240d extending to the mesa sidewall 210s.

Figure 8B:
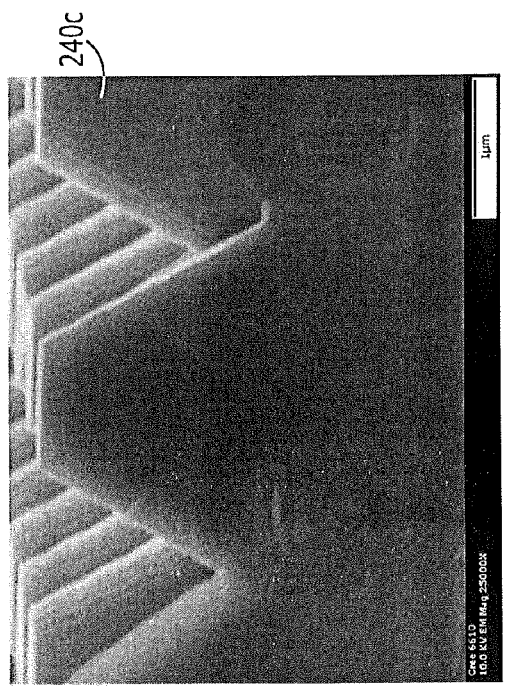
Figure 8C:
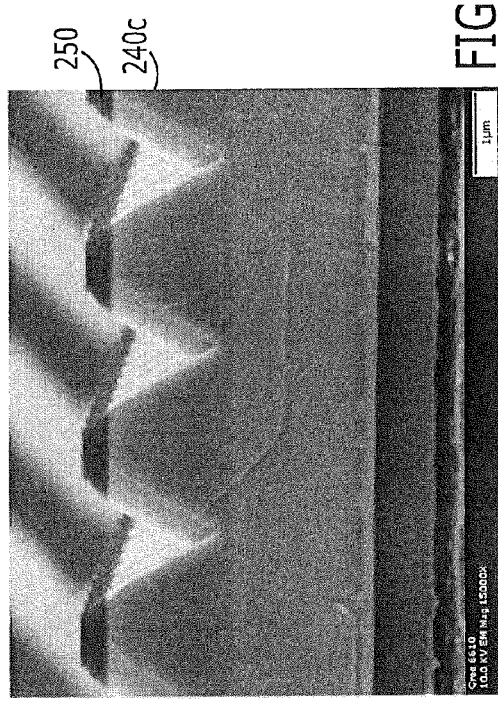
Figure 8A:
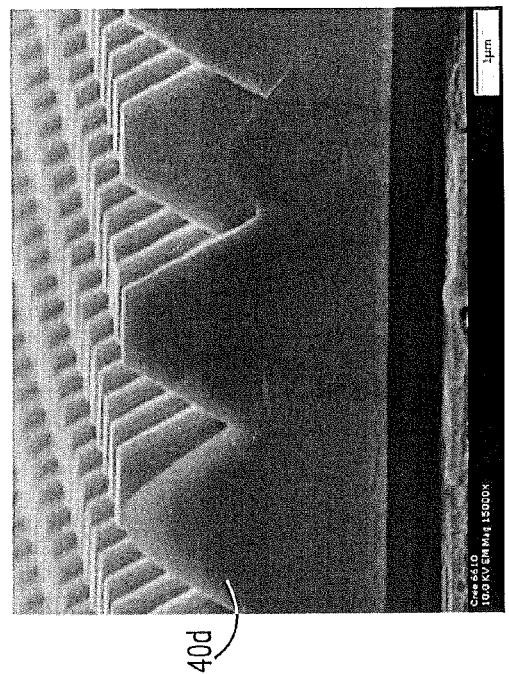

FIGS. 8A-8C are mechanical cross-section SEM photographs illustrating adjacent cones 240d that touch. FIGS. 8A and 8B illustrate different magnifications. FIG. 8C illustrates adjacent cones 240c that touch with the mask 250 still thereon.

Figure 9B:
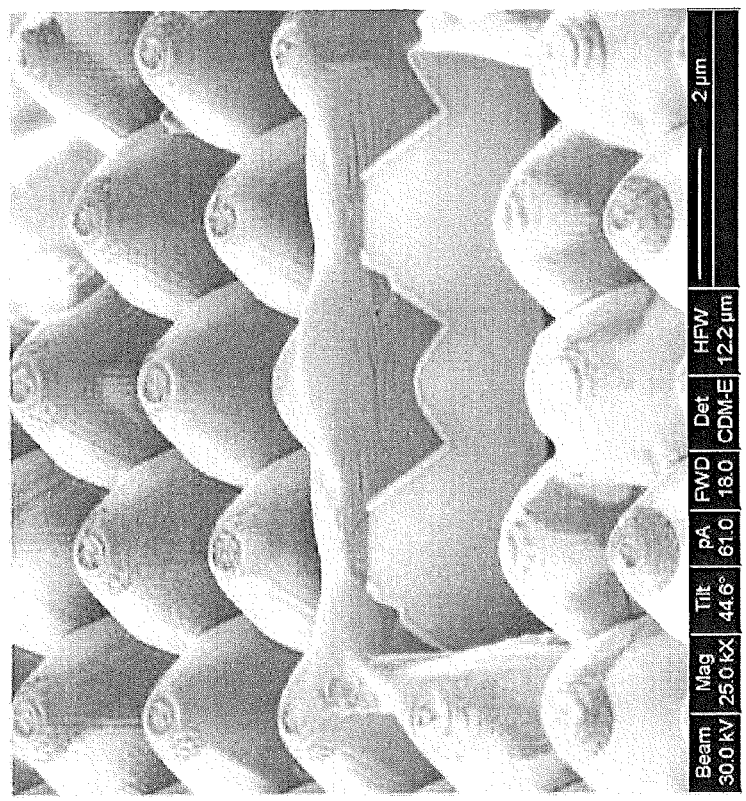
FIGS. 9A and 9B are Focused Ion Beam (FIB) cut images of various embodiments described herein.
Figure 9A:
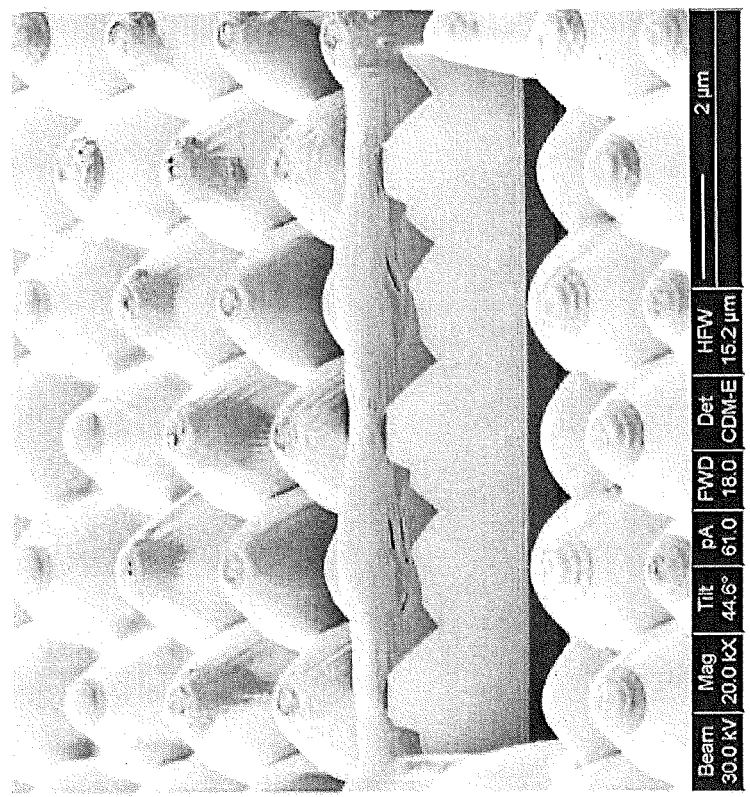

FIGS. 9A and 9B are Focused Ion Beam (FIB) images. Note that in FIGS. 9A and 9B, the surface is coated with platinum to provide the FIB images.

FIGS. 10A-10B are SEM photographs that may be used to calculate the height of the cones 240 according to various embodiments described herein. Specifically, FIG. 10A illustrates the total thickness of the Group III Nitride layer 210 as D1, and the etch depth as D2. Thus, the area at the left of FIG. 10A is the side of the device that is parallel to the major flat, the area in the center of FIG. 10A is the mesa sidewall, and the area at the right of FIG. 10A is the mesa face 210*f*. FIG. 10B illustrates an array of truncated cones 240*a* on the mesa face 210*f*, with the truncated cone radius indicated as D3.

FIG. 10C illustrates the mathematical relationship between the radius and height of the cone, according to the formula:

$$h=\tan(61.96)*R=1.877*R$$

Thus, from this geometry, the following relationships may be obtained:

Total GaN Thickness=1.877*D1
Etch Depth (mesa edge)=1.877*D2
Truncated Cone Height=1.877*D3
Remaining GaN Thickness Below Truncated Cones= (1.877*D1)−(The greater of the Etch Depth or max Truncated Cone Height.)

These distances D1, D2 and D3 may be used to design a process that will cause the crystal planes to come together at a targeted depth, in a self-limiting wet etch. Accordingly, the wet etch parameters, as well as the size and/or pitch of the mask layer, can be controlled to provide a desired truncated cone height, as well as a desired amount of separation or touching among adjacent truncated cones. Moreover, in some embodiments, the Group III Nitride layer is about 4 μm thick, and it may be desirable not to etch more than halfway into this layer, so that the truncated cone height may be less than about 2 μm, or less than about 50%.

Accordingly, various embodiments described herein can pattern a transparent dielectric and/or other film to form an array of, for example, about 1 μm to about 2 μm diameter dots on a pitch of, for example, about 3 μm to about 5 μm, to expose Group III Nitrides such as n-GaN between the dots. A basic etch, such as a KOH, may then be used to form surface features having crystal plane defined sidewall angles and, in some embodiments, random crystallographic features in the regions between the dots. In other embodiments, the dots may be formed to a have a size and pitch that results in the crystals planes in the sidewalls coming together at a depth of, for example, about 1 μm to about 2 μm below the surface, to provide a self-limiting etch process with little to no random texturing between the features. The mask that is defined prior to wet etch of the Group III Nitride may be uniform in size and pitch, may vary in size and pitch, or may be designed to form a specific geometric pattern to tailor the light extraction on a localized level, if desired.

Figure 11:
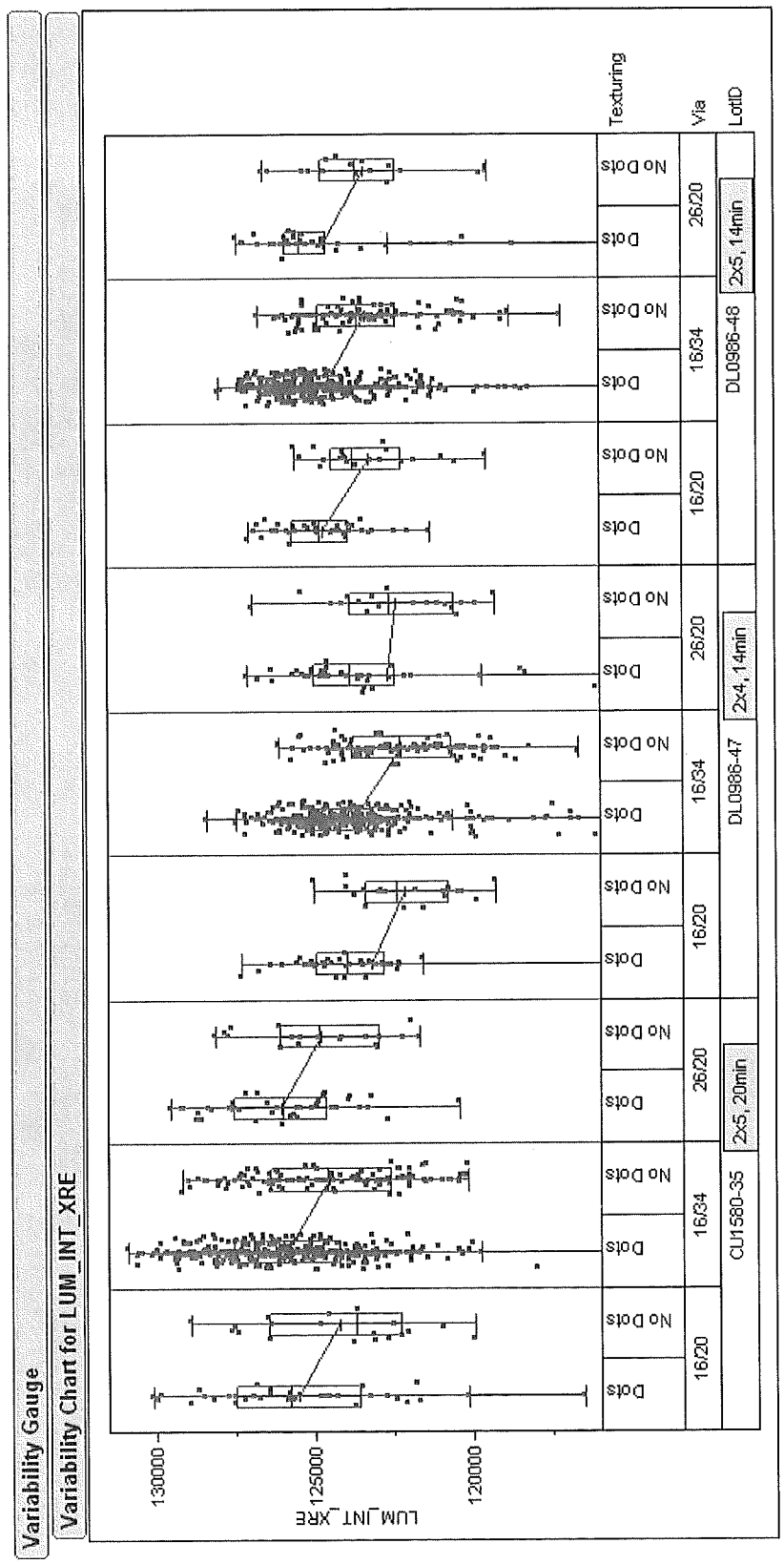
FIG. 11 graphically illustrates radiant flux for LEDs according to various embodiments described herein.

FIG. 11 graphically illustrates improved light extraction in air that may be obtained by various embodiments described herein. The data is taken from adjacent die on the same wafer using identical processing (as indicated by the "Via" row) except that "Dots" are provided according to various embodiments described herein, or "No Dots" are provided according to various embodiments of U.S. Pat. No. 8,357,923. The "LotID" row indicates the KOH etching time in minutes, for the samples with and without the dots, and the description "m×n" indicates the dot diameter and pitch, respectively, so that "2×5" indicates 2 μm dots on a 5 μm pitch. In all cases, improved radiant flux is shown by using the dots, according to various embodiments described herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. Light Emitting Diode (LED) comprising:
    a mesa that comprises a Group III Nitride mesa face and a mesa sidewall, on an underlying LED structure;
    an array of Group III Nitride truncated cones in the mesa face, at least two adjacent truncated cones in the array being spaced apart from one another; and
    a plurality of non-truncated cones between the at least two adjacent truncated cones that are spaced apart from one another.

2. An LED according to claim 1 wherein the Group III Nitride truncated cones comprise elliptical, circular and/or polygonal bases.

3. An LED according to claim 2 wherein the elliptical, circular and/or polygonal bases of at least two adjacent truncated cones touch one another.

4. An LED according to claim 3 wherein the bases of the adjacent truncated cones that touch one another form a hexagonal closest-packed structure.

5. An LED according to claim 1 wherein the non-truncated cones between the adjacent truncated cones are shorter than the adjacent truncated cones.

6. An LED according to claim 1 wherein the mesa is textured between at least two the adjacent truncated cones that are spaced apart from one another.

7. An LED according to claim 1 further comprising a transparent feature on exposed bases of the Group III Nitride truncated cones.

8. An LED according to claim 1 wherein exposed bases of the Group III Nitride truncated cones are textured.

9. An LED according to claim 1 wherein the Group III Nitride truncated cones have sides that extend along crystal planes of the Group III Nitride.

10. A Light Emitting Diode (LED) comprising:
    a mesa that comprises a Group III Nitride mesa face and a mesa sidewall, on an underlying LED structure;
    the mesa face comprising therein a plurality of Group III Nitride surface features comprising tops defined by mask features, comprising bottoms, and comprising sides that extend between the tops and the bottoms along crystal planes of the Group III Nitride.

11. An LED according to claim 10 wherein the mask features comprise a two-dimensional array of dots that are spaced apart from one another.

12. An LED according to claim 11 wherein the dots comprise elliptical, circular and/or polygonal dots.

13. An LED according to claim 11 wherein a size and/or pitch of the dots are configured so that at least some of the Group III Nitride surface features touch one another.

14. An LED according to claim 11 wherein a size and/or pitch of the dots are configured so that at least some of the Group III Nitride surface features are spaced apart from one another.

15. An LED according to claim 10 wherein the Group III Nitride surface features are produced using a wet chemical etch through the mask features.

16. An LED according to claim 10 wherein the bottoms of the plurality of Group III Nitride surface features cover at least about 35% of an area of the Group III Nitride mesa face.

17. An LED according to claim 10 wherein the bottoms of the plurality of Group III Nitride surface features cover at least about 50% of an area of the Group III Nitride mesa face.

18. An LED according to claim 10 wherein the bottoms of the plurality of Group III Nitride surface features cover at least about 90% of an area of the Group III Nitride mesa face.

19. An LED according to claim 10 wherein an aspect ratio of a height of the Group III Nitride surface features to the bottoms of the Group III Nitride surface features is at least about 0.2.

20. An LED according to claim 10 wherein an aspect ratio of a height of the Group III Nitride surface features to the bottoms of the Group III Nitride surface features is at least about 0.3.

21. An LED according to claim 16 wherein an aspect ratio of a height of the Group III Nitride surface features to the bottoms of the Group III Nitride surface features is at least about 0.4.

22. An LED according to claim 10 wherein a height of the Group III Nitride surface features is less than about 50% of a thickness of a Group III Nitride layer that is included in the mesa.

23. An LED according to claim 10 wherein an angle between the side and bottom of the Group III Nitride surface features is between about 45° and about 75°.

24. An LED according to claim 16 wherein an angle between the side and the bottom of the Group III Nitride surface features is about 62°.

25. An LED according to claim 10 wherein the bottoms of the Group III Nitride surface features touch one another and wherein a height of the Group III Nitride surface features exceeds about 1 µM.

26. An LED according to claim 16 wherein the bottoms of the Group III Nitride surface features touch one another and wherein a height of the Group III Nitride surface features exceeds about 1 µm.

27. An LED according to claim 10 wherein the mesa comprises a Group III Nitride layer that is at least about 1 µm thick beneath the bottoms of the plurality of Group III Nitride surface features.

28. An LED according to claim 10 wherein the mesa comprises a Group III Nitride layer that is at least about 2 µm thick beneath the bottoms of the plurality of Group III Nitride surface features.

* * * * *

UNITED STATES PATENT AND TRADEMARK OFFICE
CERTIFICATE OF CORRECTION

PATENT NO.         : 8,896,008 B2                                        Page 1 of 1
APPLICATION NO.    : 13/868361
DATED              : November 25, 2014
INVENTOR(S)        : Donofrio It is certified that error appears in the above-identified patent and that said Letters Patent is hereby corrected as shown below:

In the Specification
Column 5, Line 54: Please correct "format "(hid)" or"
                              to read -- format "(hkl)" or --

Signed and Sealed this
Twenty-first Day of April, 2015

Michelle K. Lee
*Director of the United States Patent and Trademark Office*